United States Patent [19]
Bickford et al.

[11] Patent Number: 5,709,906
[45] Date of Patent: Jan. 20, 1998

[54] METHOD FOR CONDITIONING HALOGENATED POLYMERIC MATERIALS AND STRUCTURES FABRICATED THEREWITH

[75] Inventors: Harry Randall Bickford, Ossining; Peter J. Duke, Endwell, both of N.Y.; Elizabeth Foster, Friendsville, Pa.; Martin Goldberg, San Jose, Calif.; Voya Rista Markovich, Endwell, N.Y.; Linda Matthew, Palo Alto, Calif.; Donald G. McBride, Binghamton, N.Y.; Terrence Robert O'Toole, Webster, N.Y.; Stephen Leo Tisdale, Endwell, N.Y.; Alfred Viehbeck, Fishkill, N.Y.

[73] Assignee: International Business Machines Corporation, Armonk, N.Y.

[21] Appl. No.: 490,930

[22] Filed: Jun. 16, 1995

Related U.S. Application Data

[60] Continuation of Ser. No. 340,379, Nov. 14, 1994, abandoned, which is a division of Ser. No. 13,652, Feb. 4, 1993, Pat. No. 5,374,454, which is a continuation of Ser. No. 584,327, Sep. 18, 1990, abandoned.

[51] Int. Cl.$^6$ ........................................... B05D 3/04
[52] U.S. Cl. ...................... 427/306; 427/301; 427/282; 427/336; 204/131
[58] Field of Search ........................... 427/96, 306, 282, 427/301, 336, 443.1; 204/131

[56] References Cited

FOREIGN PATENT DOCUMENTS 793731   4/1958   United Kingdom .

OTHER PUBLICATIONS

Benderly, A.A., Journal of Applied Polymer Science, vol. 6, 221, 1962.

*Primary Examiner*—Shrive Beck
*Assistant Examiner*—Brian K. Talbot
*Attorney, Agent, or Firm*—Pollock, Vande Sande & Priddy

[57] ABSTRACT

A method of treating a halogenated polymeric-containing substrate including exposing at least portions of the halogenated polymeric-containing substrate to a composition containing a reducing agent and an aprotic solvent selected from the group consisting of nitriles, nitro compounds, amides, esters, carbonates, oxides, sulfo compounds and mixtures thereof. The solvent is free of ethers, amines, ammonia. The composition is prepared by reacting a metal with an organic compound selected from the group consisting of polyaryl compounds, aromatic carbonyl containing compounds, aromatic nitriles, and aromatic heterocyclic nitrogen containing compounds in a reaction solvent that does not react with the metal but permits reaction between the metal and the organic compound to thereby provide the reducing agent. The reducing agent is isolated from the reaction solvent to obtain a reaction product as a solid. The reaction product is added to the aprotic solvent. The treated substrate is contacted with a material to promote adhesion of the material to the treated surface.

33 Claims, 3 Drawing Sheets

UV-Vis SPECTRA OF PFA (TETRAFLUOROETHYLENE-PERFLUORALKOXY)

A. UNTREATED TEFLON PFA FILM (2 mil)
B. REDUCED IN ANTHRACENE/DMF, 10 MIN GOLD/REFLECTIVE
C. AIR OXIDIZED, 24 HR BLACK.

UV-Vis SPECTRA OF FEP (TETRAFLUORETHYLENE-HEXAFLUOROPROPYLENE)

- A. TEFLON FEP FILM (2 mil)
- B. REDUCED IN ANTHRACENE/DMF, 10 MIN
- C. AIR OXIDIZED, 24 HR

METHOD FOR CONDITIONING HALOGENATED POLYMERIC MATERIALS AND STRUCTURES FABRICATED THEREWITH

CROSS-REFERENCE TO RELATED APPLICATIONS

This is a continuation of application Ser. No. 08/340,379 now abandoned, entitled Method for Conditioning Halogenated Polymeric Materials and Structures Fabricated Therewith, filed Nov. 14, 1994, which in turn is a divisional application of Ser. No. 08/013,652, filed on Feb. 4, 1993, and now U.S. Pat. No. 5,374,454, which in turn is a continuation of Ser. No. 07/584,327, filed on Sep. 18, 1990 and now abandoned.

DESCRIPTION

1. Technical Field

The present invention is concerned with conditioning halogenated polymeric materials to render them susceptible to being etched and/or capable of having a conductive metal plated thereon including a conductive metal from an electroless plating bath. The present invention is also concerned with a method for conditioning halogenated polymeric materials to render such capable of being made conductive by doping.

The methods of the present invention are especially advantageous for the processing of electronic devices.

In addition, the present invention is concerned with structures containing electrical conductive patterns on a halogenated polymeric containing layer.

2. Background Art

Halogenated polymeric materials such as poly(tetrafluoroethylene) (PTFE) and poly(trifluoromonochloroethylene) are attractive candidates for advanced electronic packaging applications because of their very low dielectric constants, excellent chemical stability, low solvent/moisture absorption and excellent thermal stability. In addition, certain composite halogenated polymer compositions employing composite PTFE materials using fillers such as glass or ceramic micro-particles have improved dimensional stability and a low thermal expansion coefficient (CTE).

For instance, a glass/ceramic filled poly(tetrafluoroethylene) available under the trade designation RO2800™ has a CTE (x-y) value of 16 ppm/°C. which is closely matched to the 16.9 ppm/°C. value for copper metal. This enhances the thermal cycle reliability of the RO2800™/Cu interface. The use of these materials in high performance packaging or multilevel structures would provide reduced signal delay and rise times, reduced cross talk at a given impedance, and increased circuit density. A significant enhancement in the reliability of the packaging structures would be gained because of the low water uptake by the polymer. This would tend to eliminate corrosion problems, hygroscopic expansion, and improved metal to dielectric adhesion reliability.

However, because of their relative chemical inertness and hydrophobic nature, these halogenated polymeric materials are difficult to process into electronic packaging structures. The lack of effective processing techniques has inhibited the exploitation of these materials by the electronics industry. The low surface energy of these materials gives the inability to adhere to other surfaces and must be effectively overcome to yield desirable metal adhesion for practical electronic packaging applications.

In the manufacture of printed circuit cards and boards, a dielectric sheet material is employed as the substrate. A conductive circuit pattern is provided on one or both of the major surfaces of the substrate. Since the dielectric substrate is non-conductive, in order to plate on the substrate, it must be seeded or catalyzed prior to the deposition of metal thereon.

Among the more widely employed procedures for catalyzing a substrate is the use of a stannous chloride sensitizing solution and a palladium chloride activator to form a layer of metallic palladium particles thereon. For instance, one method of catalyzing a dielectric substrate is exemplified by U.S. Pat. No. 3,011,920 which includes sensitizing a substrate by first treating it with a solution of a colloidal metal, activating the treatment with a selective solvent to remove unreactive regions from the colloids on the sensitized dielectric substrate, and then electrolessly depositing a metal coating on the sensitized substrate, for example, with copper from a solution of a copper salt and a reducing agent.

Also, as suggested, for example, in U.S. Pat. No. 3,009,608, a dielectric substrate can be pretreated by depositing a thin film of a "conductivator" type of metal particle, such as palladium metal, from a semicolloidal solution onto the dielectric substrate to provide a conducting base which permits electroplating with conductive metal on the conductivated base.

In addition, there have been various suggestions of treating substrates with certain materials in order to enhance the attachment to the substrate of a non-noble metal catalyst. For instance, U.S. Pat. No. 4,301,190 suggests a pre-wet treatment of a substrate with an "absorption modifier" to enhance the attachment to the substrate of a non-noble metal catalyst. Certain surfactants, hydrous oxide sols and certain complexing agents are suggested as "absorption modifiers".

However, the methods of catalyzing, or seeding, various organic polymer substrates have not been entirely satisfactory and improvement in the degree of adhesion of the final metal layer to the substrate has been less than desired.

This is especially true for polyhaloalkylene containing substrates such as poly(tetrafluoroethylene) (PTFE), and in fact, the lack of effective processing techniques has inhibited the effective use of these polymeric materials by the electronics industry. The hydrophobic nature and low energy of the surfaces of poly(haloalkylene) polymers render such quite difficult to metallize or bond to metal layers normally resulting in poor adhesion of metal layers to the surface.

It has been suggested, for example, in British Patent 793,731 and further suggested, for example, by A. A. Benderly, *J. Appl. Polymer Science*, 6, 221 (1962), to treat PTFE with very strong reducing species such as elemental alkali metals such as sodium in liquid ammonia or sodium-naphthalene in tetrahydrofuran solutions in order to increase the surface energy of the surface and render such "wettable" to improve adhesive bonding to metals, plastics, wood and glass.

The use of alkali metal in liquid ammonia solutions has been used to treat PTFE films for improving the adhesion for pressure-sensitive tape applications such as suggested by Fields in U.S. Pat. No. 2,946,710. Methods of "activating" perfluorocarbon polymer surfaces for improved bonding towards organic adhesive coatings by treating with alkali metals, magnesium and zinc at elevated temperatures in amine solvents or ammonia has been reported by Purvis et al. in U.S. Pat. No. 2,789,063. Rappaport in U.S. Pat. No. 2,809,130 suggests methods for improving bonding between fluorinated resins and other materials by treating surfaces with an alkali metal polyaryl hydrocarbon-solvent solution. However, none of these prior art suggestions involves using subsequent in situ reduction of a chemical modification of the fluoropolymer surface for use as a catalyst for subsequent deposition of seed metal. Dousek et al., *Electrochimica Acta*, 18, 1 (1975), discussed the use of alkali metals and alkali amalgams to treat PTFE which leads to a hydrophilic "carbonaceous" surface. Because alkali metals react explosively upon contact with water liberating hydrogen gas these systems are extremely dangerous. Commercially available sodium naphthalide solutions such as TetraEtch® (W. L. Gore and Associates) are ethylene glycol dimethyl ether solutions such as monoglyme have very low flash points (e.g. 34° F.) and react violently with water. The highly reactive nature of alkali metal-liquid ammonia and sodium naphthalide solutions along with the large capital cost required for safety and dangers associated with handling the raw reagents and waste effluent make these treatments prohibitive under industrial safety regulations.

Accordingly, the safety controls and concerns that are necessary for such a process along with the high equipment costs involved render such techniques highly unattractive from a manufacturing viewpoint.

Alternative vacuum or plasma treatment processes have the disadvantages of requiring high cost vacuum equipment and have a low throughput capability. Furthermore, such treatments are limited to altering only the outermost few atomic layers of the surface and the resulting surface modification are unstable and undergo additional changes within hours. As described in, for instance, U.S. Pat. No. 3,689,991 and Tummala, et al. "Microelectronics Packaging Handbook", pp. 409–435, Van Nostrand Reinhold, flexible polymeric films can be used as carriers in the packaging of semiconductor chips such as in the so-called TAB (Tape Automated Bonding) procedure. To date, the primary polymeric material employed for such has been polyimide.

One procedure used for employing polyimide as the dielectric and/or circuit carrier for flexible circuits involves spray coating or roller coating polyamic acid onto a sheet of metal (such as stainless steel or aluminum). The film is then cured or imidized, resulting in a film which is fully or substantially fully cured. The metal which the polyimide is on can be imaged, removed, or maintained. On top of the polyimide, three layers of metal are deposited such as by either evaporation or sputtering. The conductors are chromium or nickel, followed by a layer of copper, followed by a layer of chromium or nickel. By means of photolithographic operations, this metal is imaged into circuits. Depending on the use of the circuit, the cured polyimide may or may not be imaged, either before or after the formation of the circuit.

Flexible circuits have also been fabricated using freestanding polymeric films such as polyimides onto which metal layers are vacuum deposited, laminated, or glued. The metal circuit pattern is defined by using a photoresist pattern to either act as a plating mask or act as a mask for subtractive etching of the metal layer. Through-holes in the polymer film can be made by drilling, punching, or etching.

In a number of these situations, it is necessary to form vias in the polymeric layer to allow for electrical connections to be made between the different layers of metallurgy. In order that the interconnection be as accurate as possible, it is necessary that the polymeric films resist distortion of the desired pattern and withstand attack from other wet processing chemicals.

For instance, in the formation of multi-layer substrates for mounting chips it is necessary to electrically contact some of the conductors in the upper or second layer of metallization to some of the conductors on the lower or first layer of metallization. In order to do so, the polymeric layer must be selectively etched to form the desired vias therein to allow for metal connection between the upper and lower levels of metallization and connection to a chip and/or board.

In TAB structures certain regions (windows) must be etched in the polymer layer in order to expose metal bonding leads such as the inner and outer leads to allow both chip attachment to the TAB package and TAB package attachment to a circuit card. Caustic solutions are commonly used to fabricate such windows in TAB structures containing polyimide as the dielectric.

Conventional electronic packages have conductors comprised of defined metal regions and might have surface mounted capacitors and resistors attached. The direct conversion of certain regions of the dielectric to a conductive material would allow fabrication of planar electronic components (i.e., resistors) to be directly fabricated on the dielectric surface without requiring extra components to be attached.

Wet etching of various poly(halogenated) olefinic polymers such as poly(tetrafluoroethylene) on a commercial basis has been carried out employing alkali metals, such as sodium naphthalide or liquid ammonia solutions. However, such processes suffer from the disadvantages discussed above.

SUMMARY OF INVENTION

The present invention provides methods for treating halogenated polymeric materials in order to render them suitable for subsequent plating thereon including metals from an electroless plating bath. Moreover, the present invention provides for enhanced adhesion of the metal to the polymeric material. A further aspect of the present invention is concerned with rendering these halogenated polymeric materials readily etchable in suitable solvents to thereby provide etching processes that are relatively easy to control and do not require hazardous chemicals. The present invention also provides a method for crosslinking the halogenated polymeric material.

The present invention affords process simplification, improved chemical safety and cost advantages over other metallization methods including lamination and metal sputtering, or conventional Pd sensitization and, Sn/Pd colloidal surface seeding with electroless plating. Moreover, the present invention makes it possible to provide for direct metallization with good adhesion and without requiring the use of an adhesive or surface coating. Also, the present invention makes possible the metallization of two sides, through-holes and irregular surface features and is applicable to full-additive metallization schemes by allowing selective and patterned seeding.

In particular, according to one aspect of the present invention, a method for preparing a halogenated polymeric material-containing substrate for subsequent plating of a conductive metal thereon is provided. The process comprises contacting at least portions of at least one major surface of said substrate with a reducing agent. This treatment results in a chemical modification of the halogenated polymeric material surface and reduction thereof such that when the treated surface is then contacted with a composition containing a metal constituent wherein the metal is in the positive oxidation state such as cations of a metal or a metal complex in a solution, portions of the substrate that were contacted with the reducing agent will be reduced to metal in the zero-valent state. The metal in the zero-valent state thereby provides seed or catalytic sites for subsequent conductive metallic plating thereon including that from an electroless plating bath.

Another aspect of the present invention is concerned with providing a patterned metallic layer on a halogenated polymeric material-containing substrate. The process comprises contacting at least portions of at least one major surface of said substrate with a reducing agent. The said substrate surface contains a patterned layer of polymer, photoresist or mask which does not react with the reducing agent or process solvents permitting only contact of the said substrate and reducing agent at uncoated areas of said substrate. The substrate is then contacted with a composition containing a metal constituent wherein the metal is in the positive oxidation state such as containing cations of a metal or a metal complex which at portions of the substrate that were contacted with the reducing agent will be reduced to metal in the zero-valent state. The metal in the zero-valent state thereby provides seed or catalytic sites for subsequent conductive metallic plating thereon including that from an electroless plating bath.

A further aspect of the present invention is concerned with providing a metallic layer on a halogenated polymeric-material-containing substrate. The process includes contacting at least portions of at least one major surface of said substrate with a reducing agent; and contacting the substrate with an electroless plating bath to thereby provide a metallic layer at portions of the substrate contacted with the reducing agent.

Another aspect of the present invention is concerned with catalyzing walls of a via in a halogenated polymeric material-containing substrate for subsequent plating therein of a conductive metal. The process comprises contacting said substrate with an electrolyte; and cathodically biasing a means for forming said via to thereby electrochemically reduce said walls of said vial The via walls are then contacted with a composition containing a metal constituent wherein the metal is in the positive oxidation state such as cations of a metal or metal complex which will be reduced to metal in the zero-valent state. The metal in the zero-valent state thereby provides seed or catalytic sites for subsequent conductive metallic plating thereon including that from an electroless plating bath.

A still further aspect of the present invention is concerned with plating walls of a via in a halogenated polymeric-containing substrate with an electrically conductive metal. This process includes contacting the substrate with an electrolyte; cathodically biasing a means for forming said via to thereby electrochemically reduce the walls of the via; and contacting the substrate with an electroless plating bath to thereby provide a metallic layer on the walls.

A still further aspect of the present invention is concerned with a structure that comprises a free standing halogenated polymeric containing-layer; and an electrical conductive pattern on the layer. A preferred structure involves a conductive pattern that includes a plurality of beam leads at least a part of which extends in cantilevered fashion into an aperture in the halogenated polymeric-containing layer.

Another aspect of the present invention is concerned with forming conductive regions at the surface of a halogenated polymeric material. The process comprises exposing at least portions of the substrate to a reducing agent to cause chemical modification of the halogenated polymeric material; and then exposing the halogenated polymeric material to a dopant to thereby induce electrical conductivity in those regions of the halogenated polymeric material chemically modified by the reducing agent. Doping can be achieved through a chemical or electrochemical oxidation or reduction process. The conductive material can be used as conductive regions for circuitry or used as a base for electroless or direct electrolytic metal plating.

The present invention is also concerned with forming conductive regions at the surface of a halogenated polymeric material. The process comprises obtaining an electrode having disposed thereon a halogenated polymeric material-containing surface;

contacting the halogenated polymeric-containing surface with an electrolytic solution;

supplying a voltage between the electrode and a cathode to reduce at least portions of the polymeric material and cause subsequent chemical modification (e.g.— dehalogenation);

and then exposing the halogenated polymeric material to a dopant to thereby induce electrical conductivity in regions of chemically modified halogenated polymeric material. Doping can be achieved through a chemical or electrochemical oxidation or reduction process.

Another aspect of the present invention is concerned with etching a halogenated polymeric-containing substrate. The process comprises: exposing at least portions of said substrate to a reducing agent; and then exposing the substrate to a solvent to thereby dissolve portions of the substrate exposed to the reducing agent.

A still further aspect of the present invention is concerned with etching a halogenated polymeric-containing substrate. The process includes obtaining an electrode having disposed thereon a halogenated polymeric material-containing surface; contacting the halogenated polymeric-containing surface disposed on said electrolyte solution; supplying a voltage between the electrode and a cathode to reduce at least portions of the polymeric material; and then exposing the substrate to a solvent to thereby dissolve reduced portions of the substrate.

Another aspect of the present invention is concerned with supplying electrons to at least a portion of at least one major surface of a halogenated polymeric material in an amount sufficient to remove halogen substituents of the polymeric material and to crosslink the material from which the halogen substituents have been removed.

BEST AND VARIOUS MODES FOR CARRYING OUT THE INVENTION

Figure 1:
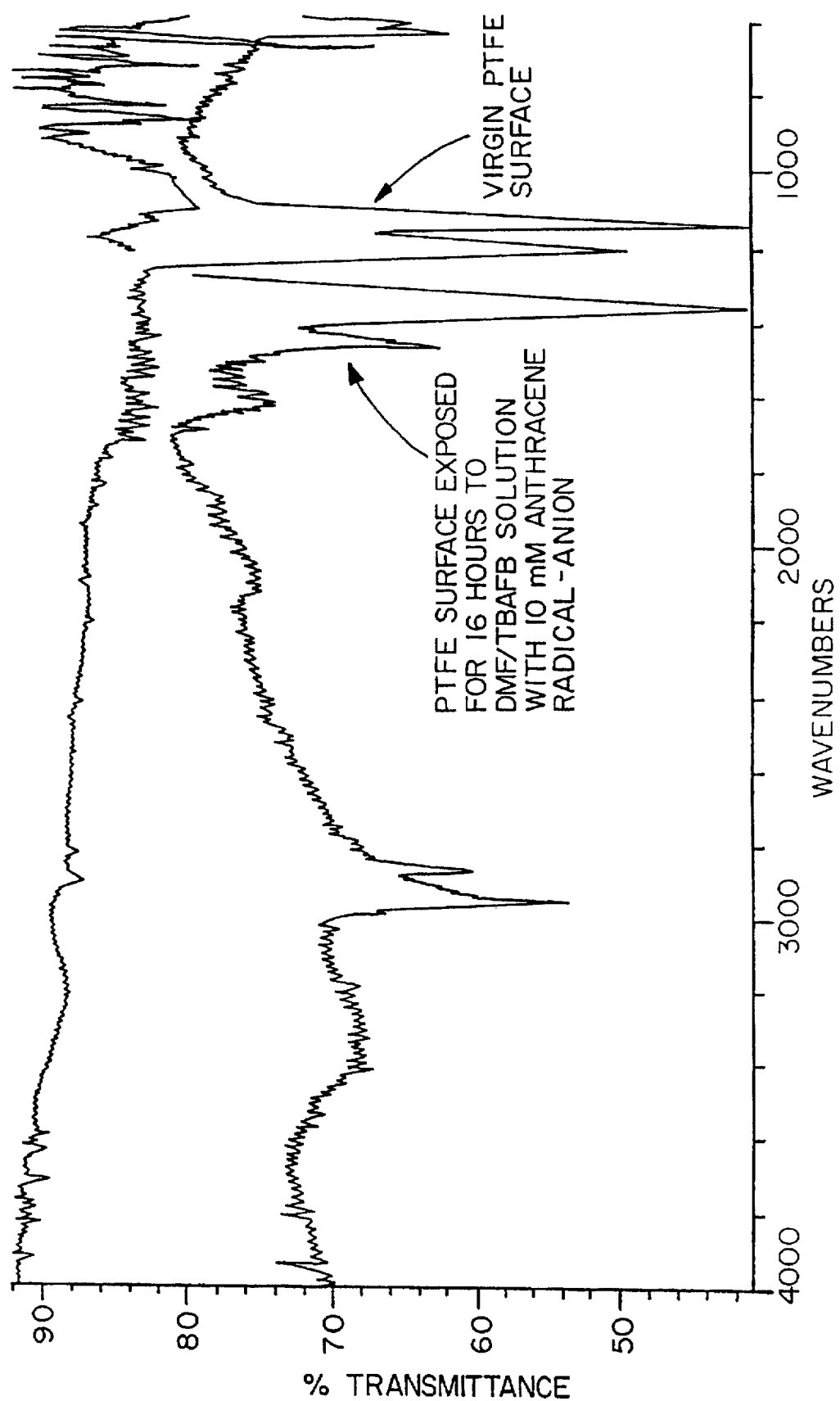
FIG. 1 is IR SPECTRA for untreated PTFE film and PTFE film treated pursuant to the present invention.

The halogenated polymeric materials treated pursuant to the present invention are well-known and include such commercially available poly(halo)ethylene materials often in the form of a film as poly(tetrafluoroethylene) given by formula —$(CF_2—CF_2)_n$—, copolymers of tetrafluoroethylene and hexafluoropropylene, polytrifluorochloroethylene, copolymers of tetrafluoroethylene with for example olefins such as ethylene and propylene; copolymers of trifluorochloroethylene with for example olefins such as ethylene and propylene; copolymers of tetrafluoroethylene with polyperfluoroalkoxy resin with general formula of:

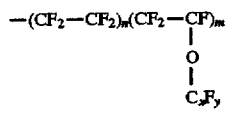

wherein n and m individually are whole number integers greater than of equal to 1, and x and y are whole number integers greater than or equal to 1; polyvinyl fluoride; polyvinylidene fluoride; polyvinyl chloride; polyvinylidene chloride; and copolymers of poly(tetrafluoro)ethylene and poly(di-trifluoromethyldioxole difluoro)ethylene having the following general formula:

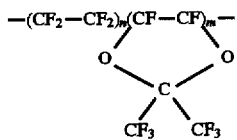

wherein the preferred mole percent of dioxole is about 45 to about 95 mole percent dioxole which yield materials have a dielectric constant of less than 2.0.

Furthermore, the polymeric material treated pursuant to the present invention can be compounded with conventional ingredients such as filler such as glass and ceramics, antioxidants, stabilizers, plasticizers, and other polymeric materials such as polyimide to comprise a blend.

The polymeric material treated can be free standing or provided on a substrate such as a metal or polyimide film. Such commercially available halogenated polymeric materials treated pursuant to the present invention include those available under the trade designations. TEFLON (DuPont registered trademark) which include polymers of tetrafluoroethylene, including TEFLON®DFEp (fluorinated ethylene-propylene copolymers); TEFLON®PFA (copolyperfluoroalkoxy-tetrafluoroethylene); TEFZEL® (copolymer of tetrafluoroethylene and ethylene); available from Allied-Signal Corporation are ACLAR® 22, 88, 33 fluoropolymer films (copolymers and terpolymer consisting primarily of chlorotrifluoroethylene) and; HALAR® (copolymer of chlorotrifluoroethylene and ethylene); KYNAR® 500 (poly(vinylidene fluoride)) available from Pennwalt Corporation; KEL-F® (polymer of chlorotrifluoroethylene); HBF-430 (polymer of chlorotrifluoroethylene); available from Rogers Corporation are RO2800™ (poly(tetrafluoroethylene)) filled with glass and ceramic particles nominally 57% by weight); RO2500™ (poly(tetrafluoroethylene)) filled with glass particles nominally 11% filler by weight); and RO2510™ (composed of Teflon® PFA having nominally 11% filler by weight) and Kapton® Type F and Type FN (polyimide coated with fluorinated ethylene-propylene copolymer) available from DuPont; Upilex® C composite film derived by coating or laminating Upilex® R polyimide film with FEP fluorocarbon resin from Ube Industries, Ltd., and distributed by ICI Americas, Inc.; Apical® AF (polyimide films coated with FEP fluoropolymer) from Allied-Signal Corporation; and DuPont Teflon® AF (copolymer of poly(tetrafluoro)ethylene and poly(di-trifluoromethyldioxole difluoro)ethylene) a soluble, spin-coatable material available as AF1600® and AF2400®.

The reducing agents can be reducing agents or be a compound having a strong electron donating power, per se, or produced such as in situ by electrochemical means. The reducing agents can be generated by chemical reaction such as by reacting benzoin and potassium tert-butoxide to generate an anionic species or by reacting alkali metal (such as Li, Na, K, Rb or Cs) with an aromatic compound such as benzophenone or anthracene to generate an anion species or alkali metal complex of the aromatic compound.

Examples of suitable organic compounds that can be electrochemically reduced in an electrolyte solution to provide the chemical reducing agent include, but are not limited to, the following groups of compounds: unsaturated aromatic hydrocarbons (e.g., anthracene 9,10-diphenylanthracene, naphthalene), aldehydes and ketones (e.g., benzophenone, benzaldehyde, acetophenone, dibenzoylmethane), imides (e.g., N-n-butylphthalimide, N,N'-di-n-butyl-3,3',4,4'-biphenyl tetracarboxylic diimide), nitriles (e.g., α-naphthonitrile, phthalonitrile), carbodiimides (e.g., bis-(p-chlorophenyl carbodiimide), aromatic heterocyclic nitrogen compounds (e.g., 9,10-diazaphenanthrene, quinoline, quinoxaline, phenanthridine), anhydrides (e.g., 1,8-naphthalic anhydride, 3,3',4,4'-benzophenone tetracarboxylic dianhydride), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt), azo compounds (e.g., 4,4'-azobiphenyl), amine oxides (e.g., acridine N-oxide), and organometallic compounds (e.g., dibiphenylchromium (I) iodide, or ruthenium (trisbipyridyl)diperchlorate).

Benzophenone, anthracene, phthalonitrile, flouranthene, phenylacetylene, dibenzanthracene, benzopyrene, phenanthrene, dibenzofuluene, phenylhexatriene, fluorene, naphthacene, naphthalene, perylene and trans-stilbene are examples of specific compounds that can be reduced to provide the chemical reducing agents suitable for carrying out the present invention. The compounds can be reduced by applying such to an electrochemical cell containing an anode and a cathode, separate compartments for anode and cathode, an inert electrolyte solution, and then applying a bias, voltage, or current.

The compounds can be reduced electrochemically or by bulk electrolysis. Typically, this is done using a two-compartment cell whereby the compartments are separated by a sintered glass disk or frit having a porosity of less than about 50 µm, preferably less than 10 µm. A salt bridge or semi-permeable membrane, film, or ion exchange material also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., Ag/0.1M Ag NO₃). The cell can be purged with an inert gas such as nitrogen or argon using an inlet tube and one-way valve or bubbler, or operation can be done in a glove box under an inert atmosphere.

Electrochemical generation of the reducing agent is accomplished by either galvanostatic, potentiostatic, or voltage-controlled electrolysis. Typically, the current density range for galvanostatic reduction is 0.1 to 10 mA/cm². In potentiostatic mode, reduction is typically done by applying a potential to the cathode which is more negative (e.g., 50 mV or more) than the reduction potential for the organic compounds as measured against the same reference electrode.

For example, the bulk electrolysis to form the active reducing agent such as an anionic form of an aromatic organic compound in solution can be accomplished by potentiostatic operation using a three-electrode arrangement as described hereinabove. In this mode of operation, the reducing power or redox potential of the reducing agent solution can be controlled and continuously maintained throughout processing since a reference electrode is employed. This greatly facilitates processing using reducing agent solutions and provides reproducible solution conditions. In addition, electrochemical generation of reduced aromatic organic compounds has the advantage in that the reactive reduced form of these materials is generated on demand and does not require the storage of the reduced solution. Furthermore, the benefits of electrochemical control can be extended for use with reducing solutions comprised of the reaction between alkali metals and aromatic organic compounds by allowing electrochemical maintenance of the reducing power of the solution as the active reducing agent becomes oxidized without the need for adding additional alkali metal. This latter case requires that the presence of a supporting electrolyte so as to render the solution sufficiently conductive to support the electrochemistry.

Compounds such as potassium tert-butoxide can react with aromatic ketones and alcohols to form anionic species which can act as electron transfer (reducing) agents. For instance, potassium tert-butoxide reacts with benzoin to form the benzoin dianion.

The reducing agents are preferably generated in an aprotic solvent.

Reaction of solid alkali metals such as lithium, sodium, potassium, rubidium, and cesium with aromatic hydrocarbon compounds in solvents such as ethers including, tetrahydrofuran, dimethyl ether, dimethyl glycol ether and amine solvents such as ammonia, ethylenediamine, hexamethylphosphoramide and morpholine leads to the formation of the corresponding alkali metal-aromatic compound anion in which the reduced aromatic compound can now act as a reducing agent. The formation of the alkali metal-aromatic compound anion complex is preferred in ether solvents which facilitates subsequent isolation of the solid form of the alkali metal-aromatic compound anion complex through a chemical separation method such as precipitation, filtration, or evaporation. The solid anion complex can be redissolved and used in low-volatility solvents for better safety and manufacturing.

The synthesis of a reducing agent in an electrolyte solution can be carried out by electrochemical reduction at a cathode electrode surface. The electroreduction can be done using a potential control (potentiostat) or current control (galvanostat) mode of operation. Electrochemical reduction at a cathode electrode requires an electrochemical oxidation at an anode surface. One type of electrochemical cell configuration is the "two-compartment" configuration. In this arrangement, there is a cathode compartment and an anode compartment which are separated by a charge permeable membrane. This membrane prevents bulk mixing of the cathode compartment solution containing electrolyte (cathelyte) and the anode compartment solution containing electrolyte (anolyte) while permitting ion transport to some degree. The membrane or separator also inhibits contact of the cathode products and anode products. The "two-compartment" configuration can be arranged in a thin layer format allowing continuous flow-through operation. During sustained electrolysis, replenishment of the catholyte and anolyte might be necessary to prevent contamination and high electrolytic solution resistance. The generation of reducing agent in this system results in the accumulation of reduced species (e.g., radical-anions) in the cathode compartment. For electroneutrality requirements, as reduction occurs, cations species supplied by the anode compartment transport across the membrane.

An alternative cell configuration is the "one-compartment" configuration in which the cathode electrode and anode electrode reside in the same compartment and share the same electrotyle solution. This cell system can be run in similar control modes as discussed for the "two-compartment" configuration. In this arrangement, the cathode and anode products are free to mix and react. Therefore, reduced species generated at the cathode are free to react with oxidized species at the anode. Alternatively, the product at the electrodes can be gaseous products resulting in a change in ionic concentrations at the respective electrodes. Furthermore, the reaction at the electrode can be a deposition reaction resulting in product buildup such as electroplating or polymer deposition. Furthermore, the reaction at the anode can be a dissolution reaction such as in corrosion or etching resulting in the production of reactions. In the case of electroreducing to form a reducing agent, this mode would result in formation of cations by anode dissolution to act as counter cations for reaction or stabilization of the reducing species. For example, reduction of an organic aromatic species at a cathode electrode can be accomplished by using a lithium, aluminum, magnesium, or zinc anode which would generate cations as the counter ion for the anion. This eliminates the need for a separator membrane and individual control of the catholyte and anolyte electrolytes.

The preferred aromatic organic compounds are those which when in a reduced form (by reacting with an alkali metal) have a reducing potential in the range of −2.3 V (vs. saturated calomel electrode SCE reference potential, to which all potentials herein are referred unless otherwise stated) to −1.5 V, with a preferred range of −2.1 to −1.6 V and a most preferred range between −2.0 and −1.8 V.

The reducing potential ranges for aromatic organic anions are preferred to be more positive than the potentials where solvent reduction begins for commonly used non-aqueous, aprotic, polar solvents. It is preferred that the solvent be of a non-hazardous nature, have a high flashpoint, and have low volatility.

Examples of organic compounds which can be used include polyaryl compounds (e.g., anthracene, 9,10-diphenylanthracene) and aromatic carbonyl-containing compounds (e.g., benzophenone), aromatic nitriles.(e.g., naphthonitrile, phthalonitrile) and aromatic heterocyclic nitrogen compounds (e.g., phenanthridine). The preferred anionic form of the reacted compound is the one-electron reduced, radical-anion state because generally, they are less susceptible to decomposition and side reactions as compared to the multi-anion states such as the dianion or trianion forms.

The organic compound is typically added to the solvent in an amount to give a final concentration of about 0.01 to about 2 Molar, with the preferred concentration range of about 0.1 to about 1.2M.

A metal such as an alkali metal such as Li, Na, K, Rb, Cs; and alkaline earth metal (Be, Mg, Ca, Sr, Ba, Ra), a group 3B element (Sc, Y, La), and a lanthanum series element (Ce, Pr, Nd, Eu) is added to the organic compound/solvent mixture in an amount preferably not to exceed the organic compound concentration. The reaction mixture is most stable when maintained under a $O_2$-free and $H_2O$-free inert ($N_2$ or Ar) gas atmosphere. Upon addition of the alkali metal, typically, a highly colored (usually blue) reaction product can be seen streaming from the metal surface within about 30 seconds after addition. The preferred metal being an alkali metal with the most preferred being K and Na.

Although the alkali metal cation is the preferred cation of the organic compound anion complex, other cations can be used or exchanged for the alkali metal such as tetraalkylammonium cation, mixed alkyl-aryl ammonium cation, ammonium cation, phosphonium compound cations, quaternary ammonium cations, chelated or complexed metal cations, or other metal ions as described above. These cations can be introduced by ion exchange processes.

Although, these solutions could be used directly in the processes of the present invention, as mentioned above, the alkali metal-organic compound anion complex obtained from the above reaction can be isolated from the reaction solvent to obtain the complex in a solid or crystalline form. The solid complex can be isolated through various techniques which include rotary evaporation, vacuum distillation, or precipitation by using a non-solvent or solution chilling. Once the solid product is isolated, it should be stored under an $O_2$-free and $H_2O$-free inert gas atmosphere to achieve maximum stability of the complex.

The solid alkali metal-organic compound anion complex can be added directly to a given processing solvent such N-methyl-2-pyrrolidone to instantly generate a reducing bath for treating the polymeric materials. The complex should be added to the process solution which preferably has been prepurged to remove oxygen and water, and is maintained under an inert gas blanket. The inert gas blanket should be maintained over the reducing bath to achieve maximum useful bath lifetime. Highly concentrated reducing agent solutions can be made in this way. Additional solid complex can be continually added to the process solution to maintain the desired reducing power. The alkali metal-organic compound anion complex solution can also contain an inert supporting electrolyte salt to ensure that the solution is conductive and facilitate the treatment pursuant to the present invention. The electrolyte salt can contain a cation such as an alkylammonium, alkylphosphonium, or alkali metal and also contains an anion such as a halide, tetrafluoroborate, hexafluorophosphate, perchlorate, or aryl sulfonate ion. This supporting electrolyte is desirable if electrolysis methods such as electrochemical reduction is employed for in situ regeneration of the reducing agent or monitoring functions.

The alkali metal complexes of anthracene, 9,10-diphenylanthracene, and benzophenone are the preferred complexes.

The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), esters, cyclic esters, and ether compounds (e.g., propylene carbonate, ethylene carbonate, γ-butyrolactone, ethyl acetate, tetrahydrofuran, dimethylether), oxide and sulfo compounds (e.g., dimethylsulfoxide, acetone, liquid. sulfur dioxide, sulfolane, dimethylsulfone). The most preferred solvents are N-methylpyrrolidone, N,N-dimethylformamide, and propylene carbonate.

The halogenated material is exposed to the reducing agent usually from about 0.1 to about 30 minutes depending upon the desired degree of reduction of the polymer. The preferred exposure time is about 0.5 to about 3 minutes. The exposure to the reducing agent results in dehalogenation of the polymer structure to leave a carbon-rich surface such as forming carbon-carbon unsaturation, carbon-hydrogen bonds, and groups such as polyacetylenic units, and providing a higher surface energy and more hydrophilic surface. Certain groups formed by the reduction process can undergo electrochemical or chemical reduction to form anionic species which can then act as reducing species.

Attenuated total reflectance Fourier transform infrared (ATR-FTIR) analysis using an IBM Instruments IR-44, with a liquid nitrogen cooled HgCdTe detector and KRS-5 (thallium bromiodide internal reflectance element was done on the following materials: polytetrafluoro-ethylene, copolytetrafluoroethylene-perfluoroalkoxy, polyfluorinated ethylene-propylene, copolyethylene-tetrafluoroethylene, polychlorotrifluoroethylene, and ceramic and glass filled fluoropolymer films. Exposing these fluoropolymer films to a solution of N,N-dimethylformamide (DMF) or N-methyl-2-pyrrolidone (NMP) containing a supporting electrolyte of 0.1M tetrabutylammonium tetrafluoroborate (TBAFB) or 0.1M potassium hexafluorophosphate (KP%) and containing 10 mM anthracene which was electrochemically reduced to the corresponding radical-anion form under a nitrogen atmosphere results in the loss of carbon-fluorine (C—F) (and chlorine) bonds at the surface and the appearance of new absorbances in the infrared region. For the perfluoropolymers, surface reduction leads to greater loss of absorbances at 1203 and 1145 $cm^{-1}$ (i.e., carbon-fluorine bonds) with longer exposure to the reduction bath. Concomitant with the C—F loss is the appearance of new peaks consistent for carbon-hydrogen (C—H) bonds at 2960, 2875, 1472, 1345, and 1059 $cm^{-1}$ and carbon unsaturation at 1635, 1610, and 2100 $cm^{-1}$ possibly due to carbon-carbon double bonds (alkene units) and acetylenic bonds (alkyne units) as shown by the IR spectra in FIG. 1 for a virgin and anthracene radical-anion treated PTFE film. X-ray photoelectron spectroscopic (XPS) analysis of the carbon 1s and fluorine 1s core level spectra for PTFE films shows that exposing the PTFE surface to reduced anthracene solutions leads to loss of the fluorine signal and increased carbon signals. Similar XPS data is obtained using different solvents and supporting electrolytes which indicates that the observed changes in the core-level spectra are not due to adsorbed or incorporated reactants or solvent and is evidence that an electrochemical surface reduction and chemical modification has taken place.

Figure 2:
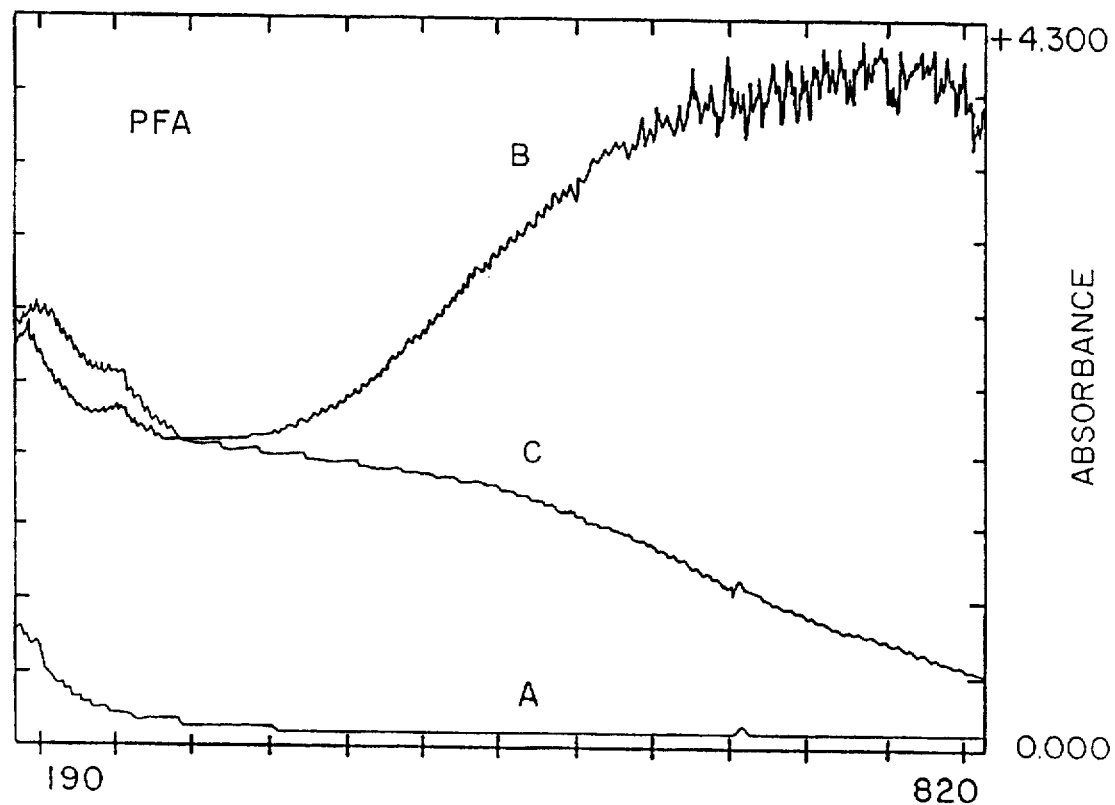
FIG. 2, is UV-Vis SPECTRA for untreated tetrafluoroethylene-perfluoralkoxy and tetrafluoroethylene-perfluoralkoxy treated pursuant to the present invention.

Ultra-violet (UV)/visible (Vis) spectral analysis of different fluoropolymer films was done using a Hewlett-Packard Model HP 8452A diode array spectrophotometer to investigate changes in absorbance properties of films during reduction and subsequent reactions. After immersing a Teflon® PFA (co-polytetrafluoroethylene-perfluoroalkoxy) film, 2 mils thick, in a DMF solution containing 10 mM anthracene radical-anion in a nitrogen atmosphere as described above for 10 minutes the originally visible transparent film has a surface modification producing a strong absorbance both in the UV and Vis region which results in a gold color, as shown by the spectra in FIG. 2. On exposing the reduced film to an oxidizing agent (e.g., air) the gold color disappears leaving a dark brown to black deposit. The visible absorbance seen for the post-reduced film is lost while the UV absorbance produced during surface reduction is still present. In addition, exposing a reduced fluoropolymer film to a solution containing dissolved metal ions (such as $Pd^{+2}$, $Ni^{+2}$ $Cu^{+1}$, $Pt^{+2}$, $Co^{+2}$, $Ag^{+1}$) or dissolved metal complexes (e.g. —$PdCl_2$, $PdCl_4^{-2}$, $Pd(ACN)_2Cl_2$, $PdBr_2$, $PtCl_2$, $PtBr_2$, $CuIP(OCH_3)_3$, $CuBF_4$, $CoCl_2$, $NiBr_2$, $PdSO_4$, AgBF$_4$) results in the loss of visible absorbance with concomitant deposition of the metal (Pd, Ni, Cu, Pt, Co, Ag) to its zero-valent state at the modified surface layer. The presence of such metal deposits is evidenced by the fact that such surfaces are readily active towards electroless metal plating solution. Similar changes in the UV-Vis spectra and process behavior are observed for reduction and oxidation of Scheme I gives possible reaction sequences for polymer reduction and modification. It is likely that such chemical groups can undergo further electrochemical reduction by the reducing agents which can initiate electro-defluorination. The visible absorbance of the reduced films is attributed to anionic forms of the chemical groups of the modified surface.

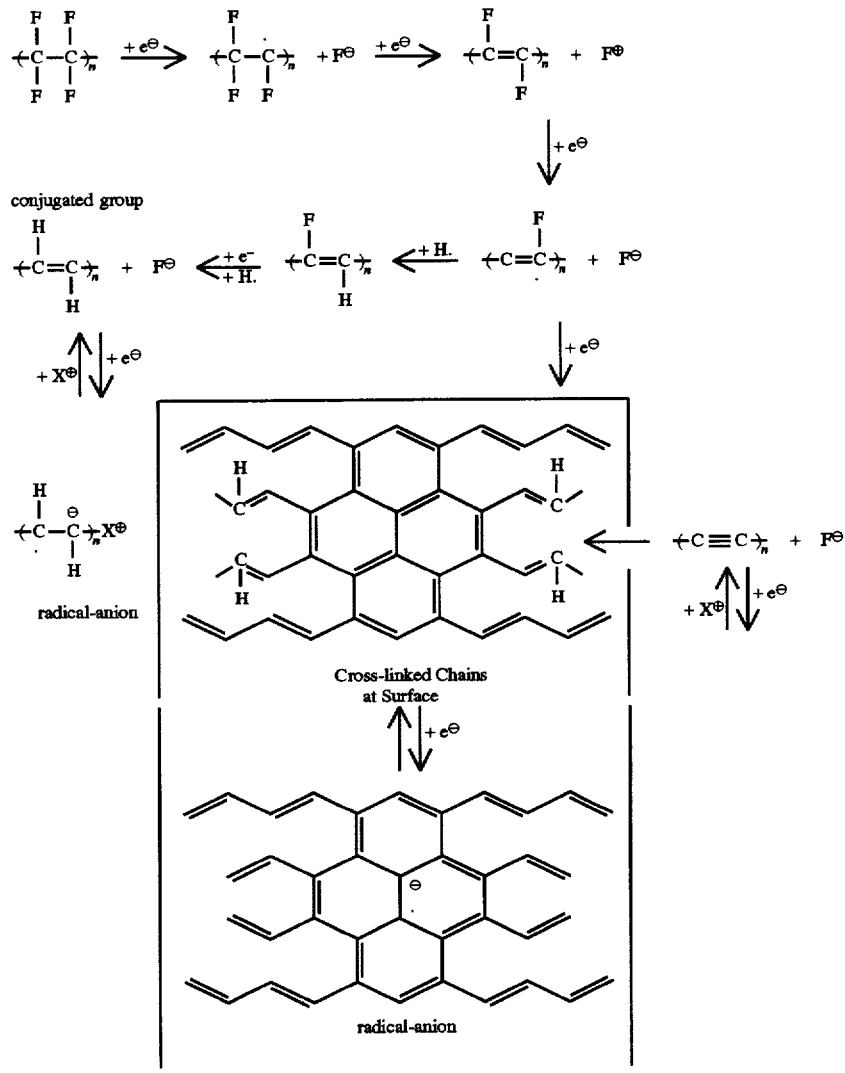

SCHEME I

Proposed mechanism for electrochemical or chemical reduction of PTFE leading to modifications and reduction of modified polymer.

Figure 3:
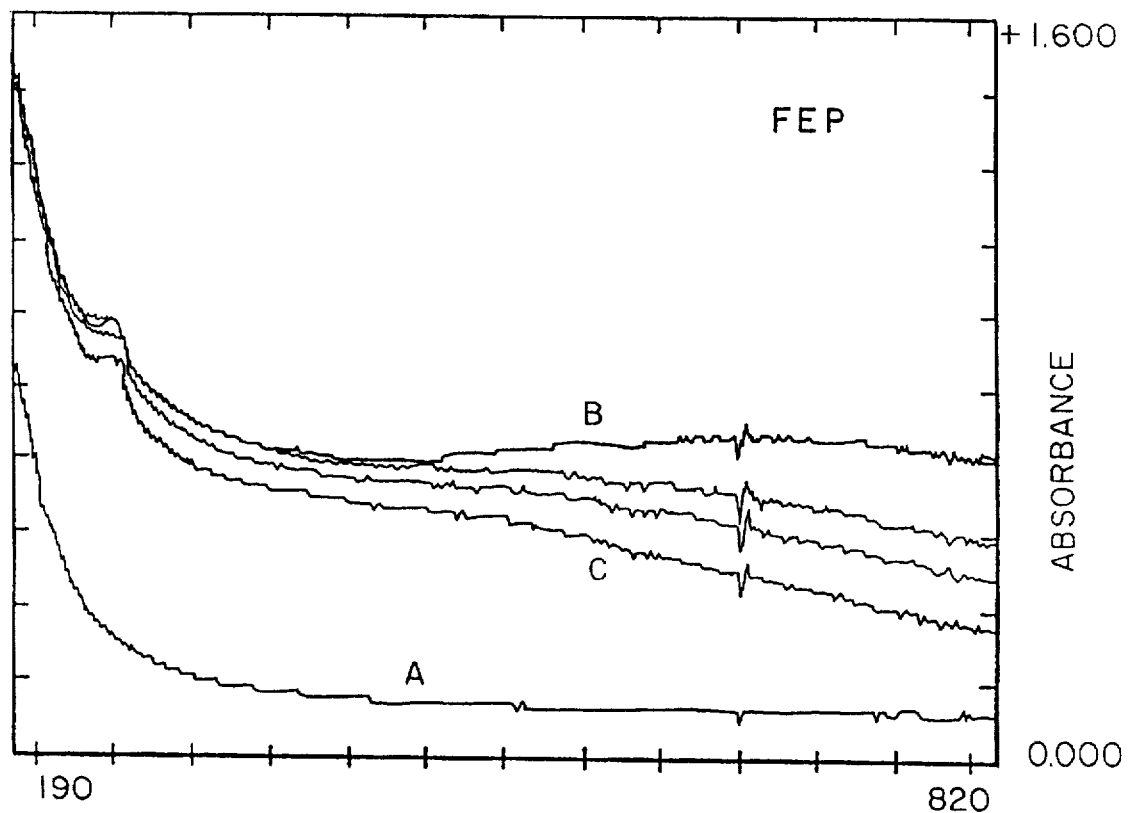
FIG. 3 is UV-Vis SPECTRA of untreated tetrafluorethylene-hexafluoropropylene and tetrafluorethylene-hexafluoropropylene treated pursuant to the present invention.

Teflon FEP (co-polytetrafluoroethylene-hexafluoropropylene) films as shown in FIG. 3. These results suggest that the reductive treatment of the polymer surface leads to an irreversible chemical modification of the polymer structure which has a UV absorbance and also produces a reversible reduced state the modified layer which can be subsequently oxidized.

It is possible that such surface reduction treatment results in electrochemical defluorination which then leads to the formation of carbon unsaturation in the generation of polyenes, polyacetylene, and polycyclic aromatic groups.

where X$^+$ is a cationic species

The energetics of fluoropolymer surface and fluorocarbon compound reduction/modification was investigated using electrochemical techniques. The minimum potential required for direct electrochemical surface reduction observed as a surface discoloration on contacting a PTFE surface with a stainless steel cathode in a DMF electrolyte solution was −1.79 V vs SCE. Cyclic voltammetry of the fluorinated model compound, 2,2,3,3,4,4,4,-heptafluorobutanol (HFBuOH), in DMF gives an onset for reduction at about −1.5 V vs. SCE. No anodic waves are exhibited on positive-going sweeps indicating an irreversible reduction process. The proposed mechanism for HFBuOH reduction is electron transfer leading to elimination of F⁻ ion and formation of HFBuOH radical proceeded by further reduction/elimination. This electrochemical data is in agreement with the ability for reducing agents with sufficiently negative oxidation potentials to lead to PTFE surface reduction. For example, anthracene radical-anion ($E°=-1.9$ V vs SCE) is more effective in reducing fluoropolymers compared to benzophenone radical-anion ($E°=-1.7$ V), while benzil radical-anion ($E°=-1.0$ V) is completely ineffective. These results are consistent with those potentials measured for other halogenated compounds in solution as discussed by Ajami in U.S. Pat. No. 4,707,230.

The electrochemical reduction treatment of a PTFE surface as described above leaves the modified surface in a reduced form capable of transferring electrons to a metal constituent wherein the metal is in the positive oxidation state such as metal ions or metal complexes in solution resulting in metal deposition at the polymer surface. This redox-mediated metal deposition process is self-limited and controlled by the amount of charge in the modified surface layer and typically leads to a diffuse (electrically noncontinuous) metal deposit. The deposition of catalytic metal particles such as Pd, Pt or Cu renders the surface active towards conventional electroless plating solutions for depositing a continuous metal layer. Additional electroless or electrolytic plating can be used subsequently to buildup metal for circuitization.

Surface modification and electroless metallization by this process results in strong and reliable metal adhesion. Peel test results show that cohesive failure occurs in the substrate bulk at a depth well below the modified surface layer. Depending on the fluoropolymer material, adhesion values from 2 to 5 lbs./inch for a 1 mil thick plated Cu can be realized. The metal/polymer interface exhibits minimal degradation after 1000 hours under 85° C., 81% relative humidity conditions and survives other packaging reliability tests such as solder shock tests for via PTH integrity. The process has been successfully used to seed for electroless plating very high aspect ratio (19:1) plated through holes with 18 mil diameter. This new process meets the stringent requirements for metallization of perfluoropolymer materials for electronic packaging applications.

The halogenated polymeric material after being reduced by the reducing agent to give chemical modification and anionic surface species can then be exposed to a solution containing a metal constituent wherein the metal is in the positive oxidation state such as metal ions or metal complexes which are subsequently reduced and deposited at the surface which can then function as the metallic sites or seeds for subsequent metallic plating.

In particular, the metal ion-containing solution can contain a cation or complex of the desired metal such as palladium, platinum, silver, gold, copper, cobalt, and nickel introduced as a metal salt which will contact the reduced portions of the polymeric material. The reduced portions of the surface will thereby transfer electrons to the cation or complex to reduce it to metal atoms in the zero-valent state.

The amount of metal and the depth of metal deposited at the surface is affected by the degree of chemical modification of the polymer and concentration of available anions for metal reduction. The metal deposit can be continuous or individual particles comprised of many metal atoms, such particles being diffusely distributed within the region near the chemically modified surface.

The method of the present invention has advantages over conventional wet, immersion or colloidal Pd seeding techniques. The deposition of diffuse seeds in a region near the chemically altered polymer surface provides mechanical interlocking between the subsequent electroless metal deposit and the polymer chains to yield increased metal adhesion. The use of strong reducing agents in these aprotic solvents in the reducing composition results in chemical alteration of the polymer and a surface roughening affect. This affect in combination with the seed deposited diffusely within the converted surface region enhances the surface adhesion. The increased hydrophilicity improves wetting of the metal deposition solution leading to greater surface area contact between the metal and modified surface enhancing mechanical interlocking. Furthermore, the formation of new chemical entities at the surface such as carbon-carbon unsaturation provides possible sites for metal bonding or chemical infraction which might provide improved metal adhesion.

According to preferred aspects of the present invention, both the reducing agent compositions and metal ion seed compositions are employed under oxygen-free and aprotic conditions since the reducing agent and reduced surface are susceptible to oxidation and hydrogenation reactions. The operations of this invention can be done at any temperature convenient for use with the compositions under an inert atmosphere, such as a blanket of nitrogen, argon, neon, helium, or hydrogen, the preferred being room temperature and nitrogen.

A preferred seeding or catalyst composition contains about 0.0001–0.05M Palladium-containing complex such as $PdCl_2$ or $PdBr_2$ and the seeding is usually accomplished within about 5 minutes. Such compositions are advantageous as compared to the common colloidal Pd/Sn seed compositions since such are stable and not subject to autocatalytic decomposition common to colloidal Pd seed systems. The palladium deposit so formed is primarily in the zero-valent state and as such is directly active towards conventional electroless plating solutions and does not require activation or acceleration treatments.

However, the chemical surface treatment by a reducing solution as pursuant to this invention can be applied to modify a fluoropolymer containing substration for subsequent conventional Pd seeding or Pd/Sn colloid seeding for electroless metallization with the advantage of improved metal adhesion and reliability.

If desired, the entire surface of the polymer can be exposed to the reducing agent or only selected portions of the substrate. When a patterned catalyst deposit is desired, selective reduction of portions of the surface of the polymeric material can be achieved by employing conventional photolithographic techniques prior to contact with the reducing agent. For example, a photoresist can be applied, selectively exposed from a pattern and then developed. Examples of suitable negative photoresists are WAYCOAT SC (J. P. Hunt) and KTFR (Kodak).

This approach permits full-additive (patterned) electroless metallization as is desired in the fabrication of multichip module packaging and printed circuit devices.

In addition, the surfaces of the polyfluorinated materials can be selectively reduced to provide for patterned metal seed deposition by an "electrowriting" process. The process as will be detailed below employs direct electrochemical reduction of the surface to irreversibly change the chemical structure of the polymer surface rendering it hydrophilic and provides improved metal adhesion. The process involves direct electrochemical reduction of the polymer surface by contacting with a cathode surface in an electrolyte solution. Selective surface modification can be done by directing the electrons to specific portions of the polymeric surface. Once the region of the surface has been electrochemically modified, additional reduction can lead to the formation of anionic species as described above.

The electrons can be supplied to the redox sites of the polymeric material also by employing electrochemical means providing the polymer onto a electrode.

A typical arrangement to carry out this particular procedure pursuant to the present invention is illustrated in U.S. Pat. No. 4,512,855.

The combination of the electrode and polymeric film is then immersed into an electrolyte solution in an aprotic solvent.

In addition, the composition used to reduce the polymer will include in the solution an inert supporting electrolyte and preferably a supporting electrolyte salt that contains as cation a member from one of the following groups: tetraalkylammonium, tetraalkyphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof-can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following tetrafluoroborate, hexafluorophosphate, aryl sulfonate, perchlorate, or halide such as bromide or iodide.

The process can be carried out by using a patterned cathode surface operating under potentiostatic, galvanostatic, AC, or DC control. The charged cathode electrode can be tailored to a specific surface structure including curtain systems, charged flat platens in the electrolyte solution, patterned platens in solution, flat rollers with continuous feed, and patterned rollers with continuous feed.

The rollers can be hydraulically pushed together to insure that sufficient contact is made to the substrate surface in a manner similar to that used in resist lamination. An additional feature of this method is that selective surface treatment can be accomplished using a movable cathode "point" electrode to "write" the pattern. This approach involves localizing the electron supply.

The rate of surface reduction depends upon the applied voltage or current and the composition of the electrolyte solution. Typically, the applied cathode potential is in the range of −2.3 V to −1.5 V (vs. SCE), but is preferred to be −2.1 V to −1.8 V (vs. SCE). The applied potential must be sufficiently negative as to initiate the reductive dehalogenation reaction.

The electrolyte solution is preferably an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), esters, cyclic esters, and ether compounds (e.g., propylene carbonate, ethylene carbonate, γ-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

The halogenated polymeric material after being reduced electrochemically can then be exposed to a solution of the metal ion in order to provide the metallic sites or seeds for subsequent metallic plating on the manner discussed above.

Another aspect of the present invention is that through-holes and blind-holes in a substrate can be treated and metallized. The process involves forming the through-hole or blind-hole mechanically by, for example, mechanical drilling or punching.

Pursuant to the present invention, the via formation is carried out with the polymeric material in contact with, for instance immersed, in an electrolyte solution. The drill bit or punch head is cathodically polarized during the via formation. Typically, the applied cathodic potential on the via formation item is −2.3 V to −1.5 V (vs. SCE) and should be sufficiently negative as to initiate electrochemical dehalogenation which is affected by the particular perhalogenated material. In this way, as the via is fabricated, contact between the polymer surface and the metal tool permits direct electrochemical reduction of the via wall. The electrolyte solutions including the supporting electrolyte salt as discussed above can be employed to accomplish the objectives of this aspect of the present invention.

The walls of the vias after being reduced can then be exposed to a solution of the metal ion in order to provide the metallic sites or seeds for subsequent metallic plating in the manner discussed above.

Instead of forming the vias by mechanically drilling or punching, the vias can be formed by employing high current technique to rapidly reduce selected portions of the polymeric material to cause polymer degradation and etching thereof. In particular, a fine "point" electrode is used to localize the charge transfer to the area where the via is desired. The polymeric material during this is in contact with, for instance immersed, in an electrolyte solution. The electrolyte solutions including the supporting electrolyte salt as discussed above can be used for this purpose. As dissolution occurs the electrode probe can be driven into the substrate. The via profile is controlled by the self-limiting etching of the via walls as the electrode probe passes. This process leaves the via wall chemically modified and capable of being catalyzed or seeded.

The potential applied to the "point" electrode must be sufficiently negative to initiate electrochemical dehalogenation, or at least >−1.5 V vs. SCE. It is preferred that the applied potential be as negative as possible but not so negative as to lead to electroreduction of the solvent or electrolyte. For example in the case of DMF, application of potential in the range −2.3 to −2.0 V vs. SCE is preferred.

The walls of the vias after being reduced can then be exposed to a solution of the metal ion in order to provide the metallic sites or seeds for subsequent metallic plating in the manner discussed above.

In addition, according to the present invention, the reduced portions of the fluorinated polymeric material can be metallized directly without the need to utilize a separate seed step prior to the metal deposition.

For example, the reduced polymer sites act as the catalyst whereby electroless metal plating is initiated by electron transfer from reduced polymer sites to metal cations in the electroless bath which deposits metal in situ and permits continued electroless plating due to the oxidation of the reducing agent provided in the electroless plating bath. However, use of the seed provides for more uniform surface activation which in turn gives more uniform electroless metal deposition and enhanced adhesion between the metal and polymer.

In any event, once the desired portions of the halogenated polymer have been conditioned to render it susceptible for subsequent deposition of a metal, the polymeric material can be electrolytically plated or exposed to an electroless metal plating bath. Suitable metals include copper, nickel, gold, palladium, cobalt, silver, platinum, tin, or mixtures thereof. The preferred metals are copper, nickel, cobalt and palladium. Suitable copper electroless plating baths and their method of application are disclosed in U.S. Pat. Nos. 3,844,799 and 4,152,467, disclosures of which are incorporated herein by reference, except that it is preferred to use a low cyanide concentration or exclude the cyanide for purposes of this invention, when forming an initial metal strike (500 to 10,000 Angstroms).

The copper electroless plating bath is generally an aqueous composition that includes a source of cupric ion, a reducing agent, a complexing agent for the cupric ion, and a pH adjuster. Such also usually include a cyanide ion source and a surface-active agent. Cyanide ions should be excluded or controlled to low levels (i.e. —1–4 ppm) when using a surface seeded with Pd metal in accordance with the present invention since the cyanide can complex and dissolve the Pd.

The cupric ion source generally used is cupric sulfate or a cupric salt to the complexing agent to be employed.

When employing cupric sulfate, it is usually employed in amounts of about 3 to about 15 grams/liter and more usually from about 8 to about 12 grams/liter. The most common reducing agent is formaldehyde which is generally used in amounts from about 0.7 to about 7 grams/liter and more usually about 0.7 to about 2.2 grams/liter.

Examples of some suitable complexing agents include Rochelle salts., ethylenediaminetetraacetic acid, the sodium (mono-, di-, tri-, and tetra-sodium) salts of ethylenediaminetetraacetic acid, nitrilotetraacetic acid and its alkali salts, gluconic acid, gluconates, triethanolamine, glucono-(gamma)-lactone, and modified ethylenediamine acetates such as N-hydroxyethylethylene-diaminetriacetate. In addition, a number of other suitable cupric complexing agents are suggested in U.S. Pat. Nos. 2,996,408; 3,075,856; 3,075,855; and 2,938,805. The amount of complexing agents dependent upon the amount of cupric ions present in solution is generally from about 20 to about 50 grams/liter or in a 3–4 fold molar excess.

The plating bath also usually contains a surfactant that assists in wetting the surface to be coated. A satisfactory surfactant is, for instance, an organic phosphate ester available under the trade designation GAFAC RE-610. Generally, the surfactant is present in amounts from about 0.02 to about 0.03 grams/liter.

Also, the pH of the bath is generally controlled, for instance, by the addition of a basic compound such as sodium hydroxide or potassium hydroxide in the desired amount to achieve the desired pH. The pH is usually between about 11.6 and 11.8.

The plating baths generally have a specific gravity within the range of 1.060 to 1.080. The temperature of the bath is usually maintained between 70° C. and 80° C. and more usually between 70° C. and 75° C. The $O_2$ content of the bath is generally contained between about 2 ppm and about 4 ppm and more usually about 2.5 ppm to about 3.5 ppm by injecting oxygen and an inert gas into the bath. The overall flow rate into the bath is usually from about 1 to about 20 SCFM per thousand gallons of bath.

In addition, the polymers in the reduced state obtained in the manner disclosed above and especially the polyimides can be readily and selectively etched by dissolving the reduced polymeric material in an aprotic organic solvent.

With respect to that aspect of the present invention concerned with etching the halogenated polymeric materials, the polymeric materials can be reduced by either direct electrochemical reduction at an electrode surface or through chemical reduction using a reducing agent in an electrolyte solution in contact with the polymeric material.

After the desired portions of the polymeric material are reduced, the material is contacted with a solvent capable of dissolving or etching the reduced portions of the polymeric material. Suitable solvents for this purpose include aprotic, polar solvents such as N,N-dimethylformamide, N-methyl-2-pyrrolidone, N,N-dimethylacetamide, propylene carbonate, hexamethylphosphoramide, dimethylsulfoxide. Other reagant systems include sulfuric, nitric, hydrochloric, phosphoric or other strong oxidizing solution which can attack the modified polymer and lead to dissolution.

The reducing pursuant to this aspect of the present invention can be carried out by any of the methods described above using a reducing agent or by electrochemical means. However, the reduction carried out for the purposes of etching is generally conducted to proceed to a greater degree than that for the purposes discussed above. For example, when employing an electrochemical technique, surface reduction is accomplished by contacting the polymeric surface with a conductive substrate under cathodic bias in a nonaqueous electrolyte solution.

The electrolyte solutions disclosed above can be used for this purpose. Electrons from the electrode are transferred into the polymer surface resulting in defluorination of the polymer structure near the surface at the contact point. The reduction reaction also leads to the generation of carbon-carbon double bonds and/or acetylenic unsaturated bonds which then can disproportionate, cross-link, and form polycyclic aromatic units. Further reduction of the chemically "modified" surface region results in the generation of anionic and radical species and ultimately results in bond scission. This reduction decomposition leads to breakdown of the polymer chain and the formation of low molecular weight species which are soluble.

The portions of the polymeric material that are not reduced are not soluble in the above solvents. In order to insure that the necessary stage of reduction has been reached to render it etchable, complete dehalogenation is first required before etching (i.e., carbon-carbon bond scission) occurs, which under reducing condition will occur first since the electroreduction of C—Cl,C—Br, C—F bonds is kinetically and thermodynamically favored.

Patterned etching of the surface can be done by using a patterned cathode electrode or by scanning an electrode across the surface.

When employing a reducing agent, those areas of the polymeric substrate that are not to be reduced are protected from contact with the reducing agent by a layer of material (e.g. resist or mask) that has been delineated by conventional lithographic processing. The compositions used for the reducing are those discussed hereinabove.

A further advantage of the etching carried out pursuant to the present invention is that the walls of the patterned impression etched into the surface would also be modified and left in a reduced form which could be directly metallized using the metallization techniques discussed above.

In fact, the metallization can be accomplished directly by employing electroless metal plating. The metal circuitry built up in the channels would yield a planar surface structure by having the metal lines embedded in the substrate. This personalization approach also eliminates the possibility of current leakage between lines because of the physical barrier between conductors.

The etching process of the present invention is advantageous over prior art alkali metal and sodium naphthalene/ ether treatment techniques since there is no need for highly reactive and explosive chemicals or highly flammable solvents. The procedure by which reducing agents are generated electrochemically has the advantages of allowing direct control of the reduction rate which can be easily monitored during processing, as discussed hereinabove. The use of alkali metal-organic compound anion complexes in low volatility solvents (e.g. NMP) eliminates the flash point concerns associated with ether solvents.

Another aspect of the present invention is concerned with forming conductive regions at the surface of halogenated polymeric materials. The process is essentially advantageous for fabricating surface resistors between circuit lines on semiconductor chips on ceramic modules (CERMET).

The present invention makes it possible to directly fabricate conducting polymer surface resistors and conductors. The reduction process pursuant to this invention can lead to the transformation of the halopolymer to polyacetylenic or conjugated groups which can be made conductive. The process includes reducing at least portions of the surface of a halogenated polymeric material and then exposing the halogenated polymeric material to a dopant to thereby induce electrical conductivity in reduced regions of the halogenated polymeric material. The reducing pursuant to this aspect of the present invention can be carried out by any of the methods described above of using a reducing agent or by electrochemical means.

If it is desired to form conductive regions at only portions of the surface of the halogenated polymeric material, patterned conductive modified polymeric surface regions can be formed by either selective surface reduction using a patterned resist mask or by patterning the modified surface with a resist prior to the doping. Patterned or selective modification of the surface can also be carried out electrochemically by localizing electron supply to selected portions of the surface such as by using a movable cathode "point" electrode to "write" the pattern.

In the case of reductive doping, the modified halopolymer material is reduced and positive ions are incorporated to maintain electroneutrality, while oxidative doping results in the oxidation of the polymer and requires negative ions to balance the charge.

Dopants used to provide the conductivity include reductive or oxidative doping such as iodine.

Reductive doping can be accomplished through a variety of chemical or electrochemical means such as exposure to hydrogen or by exposure to a reducing solution as those included herein. Oxidative doping can be done by treating with a sufficiently oxidizing solution (e.g., persulfate) or exposure to iodine vapors. Conductivity imparted by oxidative or reductive doping is obtained by introducing mobile charge carriers (electrons or holes) onto conjugated units of the chemically modified perhalopolymer material.

The techniques of the present invention can be advantageously used in a wide variety of processes to fabricate various structures some of which will be described below.

An integrated circuit board and specifically a circuitized power core layer can be obtained by the following sequence of fabrication steps. In particular, a circuitized power core is obtained by laminating a metal layer, such as copper or copper-invar-copper to a fluorinated polymeric substrate typically about 1 to about 10 mils thick. The top and bottom surfaces of the laminate are roughened to facilitate subsequent adhesion steps by removing the sacrificial copper layer by etching such as using a ferric chloride or persulfate etchant composition. Next, via holes are provided and the walls of the vias of the fluorinated polymeric material reduced according to the techniques discussed hereinabove.

Next, the desired power planes on the outer surfaces of the fluorinated polymeric material are etched back, for instance, by employing chemical wet etching such as a ferric chloride or cupric chloride solution or by an electrochemical-assisted anodic etching process.

For example, electroetching of a Cu core exposed within through holes can be done by applying a constant d.c. voltage of 1.15 V between the core and some other electrode such as a piece of Cu or Pt foil, where the Cu core is made positive with respect to the other electrode. The solution used for this etching can be in general any acidic aqueous solution such as $0.35M\ H_2SO_4$ or a neutral salt solution such as 0.5M sodium nitrate. The voltage is applied typically for more than 30 seconds and maintained until the desired amount of material is removed.

A dielectric layer is then provided over the defined power plane in order to insulate such by solvent coating, spin casting or electrophoretic deposition of a dielectric material. A typical procedure employed can be electrophoretic deposition of a dielectric layer such as photoresist, epoxy or polyimide layer. Typically, such layer is about 0.1 mils thick to about 5 mils thick.

Power plane vias are then provided by the techniques discussed above and the walls of the vias through the fluorinated polymeric material are reduced by the techniques described hereinabove. The walls of the vias are then provided with a seed or catalytic material such as palladium as discussed above.

A pattern is then provided in the insulating layer by employing conventional lithographic techniques such as applying a photoresist material such as KTFR or WAY-COAT SC, negative resist materials. The resist is then exposed through a suitable mask to actinic light and then developed to provide the desired pattern. The dielectric material is then removed in the desired locations exposing the underlying metallic material of the power plane. On top of the exposed portion is plated from an electroless bath a conductive metal such as copper or nickel and preferably copper to provide the desired pattern. Next, the remaining photoresist is stripped from the structure by well-known techniques to thereby provide the desired power core layer.

Another structure is provided by reducing the surface up to about 20–1000 Å of a fluorinated polymeric material film of about 0.3 to about 5 mils thick and typically about 3 mils thick. The surface layer can be reduced by the techniques discussed above and preferably by contact with a reducing agent. Inner/outer lead windows and fiducial marks are then provided in the polymeric substrate such as by punching or excising the fluorinated polymeric material. Fiducial marks are mechanical alignment holes for continuous feed or roll-to-roll handling in TAB tape processing. A photoresist and preferably a negative photoresist such as KTFR or WAYCOATE is laminated to both sides of the fluorinated polymeric substrate to a thickness typically of about 0.1 to about 3 mils thick, an example which is about 1 mil thick. The photoresist material is then exposed to a pattern to actinic light through a mask to thereby provide an image within the inner/outer lead window areas. The resist is developed in the inner/outer lead window areas and preferably leaving an overlap onto the fluorinated polymeric material near the edges of the windows of about 2 to about 20 mils to insure that the resist is held in place. Both sides of the fluorinated polymeric film and laminated photoresist are then blanket seeded with, for example, palladium by the catalyzing or seeding procedures discussed above. A metal layer of about 500Å to about 0.2 mils thick is then provided over the seed from an electroless strike bath. A typical example of a suitable copper strike bath contains 15 g/L $CuSO_4.5H_2O$; 62 g/L KNa $C_4H_4O_6.4H_2O$; 22 g/L NaOH; 20 ppm Gafac® surfactant; and 75 75 ml/L HCHO in $H_2O$ and used at normal room temperatures. Next, a photoresist layer is laminated onto both sides of the substrate followed by selective exposure to actinic light through a mask to provide the desired circuit pattern. The photoresist can be the same or different than the photoresist employed in the prior step of this procedure. The photoresist is developed to thereby opened circuit areas and exposing the plated and seeded areas. Additional metal is then plated up to the desired thickness such as by an electrolytic plating process employing an acidic copper plating bath. A typical bath containing 59 g/L $CuSO_4.5H_2O$; 28 ml/L concentrated $H_2SO_4$; 50 ppm HCl; and 10 ml/L Chemcut Corp. additive, and using a plating rate of 10 to 35 $mA/cm^2$ employing copper anodes. The resist is then stripped by etching in a suitable solvent and the layer from the strike bath is then removed by flash etching such as using an etching composition containing ferric chloride and HCl. The first photoresist layer can now be stripped. The copper plating is then plated with a layer of gold to facilitate subsequent soldering or other types of connections. The substrate can then be cut to provide the desired sizing for use as a TAB package.

Another procedure to fabricate a structure includes the steps of reducing about 20–10001 Å of both sides of a fluorinated polymeric material film such as Kapton® Type FN which is a polyimide film of about 0.5 to 3 mils coated on both sides with a 0.1 or 0.5 mil thick fluorinated ethylenepropylene copolymer. Both surfaces are then blanket seeded and plated with about 500–10,000Å mils thick copper layer from an electroless strike bath by the techniques discussed above. A photoresist is then laminated to both sides of the surface. The photoresist is then patterned by conventional photolithographic techniques by exposure through a mask followed by subsequent developing to provide the desired circuit pattern. The circuit pattern is then plated to the desired metallic thickness such as by an electrolytic plating typical of which is an acidic copper plating bath as described above.

Next, the remaining photoresist is removed by employing a suitable stripping composition. A second photoresist is then laminated to both sides of the substrate. The second photoresist is then exposed through a mask to actinic light to define the desired inner/outer lead window and the photoresist is then developed. The metallic layer from the strike bath is then removed by flash etching to thereby leave the window etch mask in place. The inner/outer lead windows are opened by etching the polymeric material employing a aprotic solvent. The second photoresist is then removed by stripping and the underlying metal layer is removed by flash etching. The copper layers can then be gold plated to enhance their ability to be soldered and the structure is sized to desired size by cutting.

Another technique to fabricate a structure includes reducing about 20–1000Å on each side of a fluorinated polymeric material substrate of about 0.3 to about 5 mils thick by the techniques described above. Both sides of the substrate are then blanket seeded and coated with a metal layer of about 500 to about 10,000 Å thick from an electroless strike bath as described above. A photoresist is then laminated to both sides of the substrate. The photoresist is patterned to provide desired circuit pattern by conventional photolithographic techniques by exposing the photoresist to actinic light through a mask followed by developing the photoresist to open the desired circuit areas. Metal is then plated up to the desired thickness in the opened circuit areas by, for example, electrolytic plating. Typical electrolytic bath is an acidic copper plating bath of the type described above. The photoresist is then stripped and the thin metallic layer from the strike bath is removed by a flash etching. A second photoresist is then laminated to both sides of the substrate. This photoresist is patterned to provide the desired inner/outer lead window areas by conventional photolithographic means. In particular, the second photoresist material is exposed to actinic light through a mask to define the desired inner/outer lead window areas and then the resist is developed.

The fluorinated polymeric material is then laser ablated from each side to thereby open the desired windows and leads with, for example, 193 nm wavelength laser. The second photoresist is then stripped and the copper circuitry is provided with a gold layer. The structure can then be sized to desired size by cutting.

Another fabrication process comprises coating onto both surfaces of a fluorinated polymeric material substrate such as by spin-coating a photoresist such as KTFR or WAY-COATE SC. The photoresist is then subjected to conventional photolithographic technique by exposure through a mask to actinic light to provide the desired circuit pattern followed by development of the resist to open the desired circuit areas. Next, the bare surface areas, those not covered by the photoresist, are then reduced by the techniques described above to a thickness of about 20 to about 1000 Å. Seed metal is then deposited at the reduced surface areas. The metal circuit pattern is then provided by plating from an electroless plating bath such as an electroless copper plating bath of the type described above. The photoresist is then removed by stripping.

A second photoresist is then laminated to both sides of the substrate. The inner/outer lead window areas are then defined by conventional photolithographic techniques such as by exposure through a mask and then development of the photoresist to provide the desired inner/outer lead window areas. The inner/outer lead windows are then opened by removing the fluorinated polymeric material not protected by the photoresist material such as by wet etching or preferably by laser ablation.

The second photoresist is then stripped and the copper lines are gold plated. The device can then be sized to desired dimensions by cutting.

It is further noted that in any of the above described fabrication techniques, the reduction of the fluorinated polymeric material can be carried out by direct electrochemical reduction using a patterned electrode substrate. This eliminates the need for at least one of the photoresists in order to define the area that will be metallized. However, a subsequent resist pattern may be desired prior to electroless plating in order to prevent lateral metal buildup which could lead to shorting and limit resolution of the metal lines during plating on a flat surface.

The following non-limiting examples are presented to further illustrate the present invention.

EXAMPLE 1

A one liter solution of N,N-dimethylformamide (DMF) containing 0.05M anthracene and 0.1M tetrabutylammonium tetrafluoroborate (TBAFB) is purged thoroughly with purified nitrogen gas (having <2 ppm oxygen) or assembled and maintained in a nitrogen glove box is electrochemically reduced at a constant current of 70 mA using a platinum mesh cathode (approximately 90 cm area) using a two-compartment cell separated by a fritted glass disk (porosity <8 μm) with continuous solution stirring. The average measured cathode potential is −2.1 V vs. saturated calomel electrode (SCE). During electrolysis the characteristic blue color of the anthracene radical-anion generated at the cathode surface diffuses into the solution. On further reduction the solution darkens and becomes nearly black and opaque. The reduction is discontinued when 15% of the anthracene content is converted to the anthracene radical-anion form resulting in a 7.5 mM anthracene radical-anion concentration.

Six PTFE blocks measuring 10 cm×10 cm×0.5 cm are immersed in the anthracene/DMF reducing agent solution described above for 30 seconds, 1 minute, 3 minutes, 5 minutes, 10 minutes, and 30 minutes each. This treatment results in discoloration of the PTFE surface and greater darkening is observed with increasing exposure time in the anthracene/DMF solution. Rinsing the samples in nitrogen purged DMF has no affect on the surface color. Deposition of catalytic metal seeds is accomplished by immersing the reduced samples in a DMF solution containing 5 mM $PdCl_2$ for 2 minutes. The samples are then rinsed with DMF and dried. The surface exhibits no electrical conductivity. All operations to this point are performed under an inert atmosphere. The operations which follow are under ambient conditions unless stated otherwise.

An electroless copper plating solution having the following composition: 15 g/L $CuSO_4.5H_2O$; 62 g/L $KNaC_4H_4O_6.4H_2O$ (Rochelle salt); 22 g/L NaOH; 20 ppm Gafac 610; and 7.5 ml/L HCHO (37%) is prepared with deionized water. The above treated PTFE samples are immersed for 3 minutes in the electroless Cu bath at room temperature. Highly reflective, continuous Cu metal films are electrolessly deposited onto the PTFE surfaces.

The copper thickness is increased to 1 mil by electrolytic plating using an acid copper solution having the following composition: 59 g/L $CuSO_4.5H_2O$; 28 ml/L conc. $H_2SO_4$; 50 ppm HCl; and 10 ml/L surfactant solution, and plating rate of 20 mA/cm². 30 mil wide polymer decals are applied to the Cu surface and the sample is then exposed to a $FeCl_3$/HCl etchant solution to selectively remove any exposed Cu in order to define the 30 mil wide adhesion peel lines. Peel tests (90°) results give adhesion values between 2.0±0.5 lbs./inch with cohesive failure occurring well within the PTFE substrate bulk. A PTFE sample treated for 30 minutes in the reducing bath and subsequently metallized with peel lines has a time zero adhesion value of 1.8 lbs./inch. After 100 hours under 85° C./85% relative humidity conditions, the adhesion increases to 2.7 lbs./inch with cohesive failure well within the PTFE substrate bulk.

EXAMPLE 2

An anthracene reducing solution and Pd seeded PTFE substrates are prepared as in Example 1. An electroless nickel plating solution is made using 30 g/L $NiCl_2 6H_2O$; 22 g/L $Na_3 C_6H_5O_7.2H_2O$ (sodium citrate); 50 g/L $NH_4Cl$; 10 g/L $NaH_2PO_2$; pH 8.5 and used at 85° C. Exposure of the Pd seeded PTFE substrates to this electroless Ni bath for 3 minutes results in the deposition of highly reflective, electrically conductive Ni films. Electrolytic acid Cu plating is done to increase the metal thickness to 1 mil and peel lines are formed as described in Example 1. Adhesion values measured are similar to those prepared in Example 1 with cohesive failure occurring well within the PTFE substrate bulk.

EXAMPLE 3

A one liter solution of N-methyl-2-pyrrolidone (NMP) containing 0.05M anthracene and 0.1M tetraethylammonium tetrafluoroborate (TEAFB) is prepared and subjected to conditions and electrolysis as described in Example 1. The reductive electrolysis of anthracene is discontinued when 15% of the anthracene content is converted to the corresponding radical-anion form to give a 7.5 mM reducing agent concentration.

PTFE blocks measuring 10 cm×10 cm×0.5 cm are immersed in the anthracene/NMP reducing agent solution prepared as above for times ranging between 1 minute and 1 hour, with resulting surface discoloration but to a lesser degree as compared with similar exposure times in the anthracene/DMF solution as described in Example 1. Rinsing the samples in nitrogen purged NMP has no affect on the surface color. Deposition of catalytic metal seeds is accomplished by immersing the reduced samples in a NMP solution containing 5 mM $PdCl_2$ for 2 minutes. The samples are then rinsed with NMP and dried. The surface exhibits no electrical conductivity. All operations to this point are performed under an inert atmosphere. The operations which follow are under ambient conditions unless stated otherwise.

An electroless copper plating solution and procedure for depositing a copper film on the PTFE surfaces is as described in Example 1. Immersion for 3 minutes in the electroless Cu plating bath gives highly reflective, electrically continuous Cu deposits.

EXAMPLE 4

An anthracene reducing solution and Pd seeded PTFE substrates are prepared as in Example 3. An electroless nickel plating solution is prepared as described in Example 2 and used to deposit highly reflective, electrically continuous Ni films onto the Pd seeded PTFE substrates.

EXAMPLE 5

An anthracene reducing solution is prepared as described in Example 1. A transparent film of Teflon® PFA measuring 2 cm×10 cm×2 mil thick is immersed in the anthracene/DMF bath for 5 min and Pd seeded and an electroless Cu film is deposited as described in Example 1.

EXAMPLE 6

An anthracene reducing solution is prepared as described in Example 1. A transparent film of Teflon® FEP measuring 2 cm×10 cm×2 mil thick is immersed in the anthracene/DMF bath for 5 min and Pd seeded and an electroless Cu film is deposited as described in Example 1.

EXAMPLE 7

An anthracene reducing solution is prepared as described in Example 1. A film of HBF-430 (polychlorotrifluorethylene with filler) measuring 2 cm×10 cm×2 mil thick is immersed in the anthracene/DMF bath for 3 minutes and Pd seeded and an electroless Cu film is deposited as described in Example 1.

EXAMPLE 8

An anthracene/DMF reducing solution is prepared as described in Example 1. Two RO2800™ (PTFE) samples measuring 4 cm×4 cm×5 mils are exposed to the reducing bath for 30 seconds and 30 minutes each to cause surface reduction. The samples are then rinsed with acetonitrile (ACN) and seeded with Pd by subsequent immersion in a solution containing 2.5 mM $PdCl_2$ in ACN for 2 minutes. Rutherford backscattering analysis of a portion of the surface of each sample gives $8.6×10^{15}$ Pd atoms/cm² for the 3

27 minutes reduction and $3.5 \times 10^{16}$ Pd atoms/cm$^2$ for the 30 minutes reduction. ESCA surface analysis shows significant loss of fluorine and increased carbon signal which is also more pronounced for the longer exposure. Uniform electroless Cu and Ni deposits are readily formed in an electroless Cu solution as described in Example 1 and uniform Ni deposits are formed in an electroless Ni solution as described in Example 2 after 15 minutes plating. The metal thickness is increased by electrolytic acid Cu plating as described in Example 1. The following table lists results of 90° peel testing done using 2 mm wide Cu line strips defined by selective subetching and subjected to 85° C./85% relative humidity environment.

| REDUCTION TIME (min) | ELECTROLESS METAL | INITIAL LBS/IN | 100 HOURS LBS/IN | 1000 HOURS LBS/IN |
|---|---|---|---|---|
| 0.5 | Cu | 3.4 | 3.8 | 2.7 |
| 0.5 | Ni | 2.5 | 3.1 | 2.8 |
| 5 | Cu | 1.1 | 1.6 | 1.8 |

EXAMPLE 9

An anthracene/NMP reducing bath is prepared as described in Example 2. Two RO2800™ (PTFE) samples measuring 4 cm×4 cm×5 mils are exposed to the reducing bath for 30 seconds and 30 minutes each to cause surface reduction. The samples are then rinsed with ACN and seeded with Pd by subsequent immersion in a solution containing 2.5 mM PdCl$_2$ in ACN for 2 minutes. Rutherford backscattering analysis of a portion of the surface of each sample gives $1.1 \times 10^{15}$ Pd atoms/cm$^2$ for the 3 minutes reduction and $2.3 \times 10^{15}$ Pd atoms/cm$^2$ for the 30 minutes reduction. ESCA surface analysis shows significant loss of fluorine and increased carbon signal which is also more pronounced for the longer exposure. The chemical modification for the NMP reducing bath occurs to less of an extent as compared to a similar bath using DMF. Uniform electroless Cu and Ni deposits are readily formed in an electroless Cu solution as described in Example 1 and electroless Ni solution as described in Example 2 after 15 minutes plating. The metal thickness is increased by electrolytic acid Cu plating as described in Example 1. The following table lists results of 90° peel testing done using 2 mm wide Cu line strips defined by selective subetching and subjected to 85° C./85% relative humidity environment.

| REDUCTION TIME (min) | ELECTROLESS METAL | INITIAL LBS/IN | 100 HOURS LBS/IN | 1000 HOURS LBS/IN |
|---|---|---|---|---|
| 0.5 | Cu | 3.1 | 3.6 | 3.3 |
| 0.5 | Ni | 2.9 | 3.0 | 2.9 |

EXAMPLE 10

An anthracene solution is prepared as in Example 1 except using instead of TBAFB, 0.1 M KFP$_6$ is used as supporting electrolyte. PTFE, PFA, HBF-430, and RO2800 samples are reduced for 5 minutes and Pd seeded as in Example 8. ESCA analysis of a portion of the RO2800 sample is similar to that for samples analyzed in Example 8. Uniform electroless Cu and Ni deposits are readily formed on all these substrates in an electroless Cu solution as described in Example 1 and electroless Ni solution as described in Example 2 after 15 minutes plating.

28

EXAMPLE 11

An anthracene/NMP reducing bath is prepared as described in Example 2. Samples of Kapton® FN measuring 4 cm×4 cm×5 mils is exposed to the reducing bath for 3 minutes to cause surface reduction and results in discoloration of the surface. The samples are then rinsed with ACN and seeded with Pd by subsequent immersion in a solution containing 2.5 mM PdCl$_2$ in ACN for 2 minutes. Uniform electroless Cu and Ni deposits are readily formed in an electroless Cu solution as described in Example 1 and electroless Ni solution as described in Example 2.

EXAMPLE 12

RO2800 samples are exposed to an anthracene/NMP reducing bath as described in Example 2 for 5 minutes, then rinsed with ACN and dried at 90° C. for 30 minutes in a vacuum oven under ambient conditions resulting in a textured surface for improving resist adhesion. Waycoat SC liquid photoresist is applied and irradiated through a mask having a VLSI packaging pattern. The resist is developed leaving behind a patterned resist layer having 2 mil wide channels and 4 mil-wide resist regions as a negative of the desired circuit pattern. The resist patterned substrate is then immersed in the anthracene/NMP reducing bath of this example for 5 minutes, then rinsed with ACN and the exposed modified RO2800 areas Pd seeded as described in Example 9. After seeding, the substrate is thoroughly rinsed for 5 minutes with a stream of methanol and dried before exposing to an electroless Cu solution as described for 10 minutes to deposit a Cu layer onto those areas not coated with the resist layer. This patterned electroless deposition process can also be done by application of an appropriate resist to a previously untreated fluoropolymer surface.

EXAMPLE 13

A DMF solution containing 0.05M benzophenone and 0.1M TBAFB was subsequently prepared and electrochemically reduced and maintained as described in Examples 1 and 2. The reductive electrolysis is then discontinued after 15% of the benzophenone content was converted to the corresponding benzophenone radical-anion form to yield a 7.5 mM radical-anion solution. A sample of PTFE, Teflon PFA, and RO2800 are each immersed for 5 minutes to reduce the substrate surface. Pd seeding is accomplished by subsequent exposure to a solution of 5 mM PdCl$_2$ in ACN, rinsed with ACN and dried in air. Uniform electroless Cu or Ni deposits can be formed on these Pd seeded substrates as per previous plating descriptions.

EXAMPLE 14

A sodium anthracene (NaAn) solution is prepared by adding about 3.56 g of anthracene to about 200 ml tetrahydrofuran (THF) under a nitrogen atmosphere and with continuous stirring. A total of about 0.46 g of sodium metal is then added to the mixture resulting in the formation of a soluble blue-colored product on the metal which diffuses into the bulk solution. This product is identified as the anthracene radical-anion form and has visible absorbance peaks at 726, 698, 656, 594 and 548 nm. After the Na dissolves, a piece of Teflon PFA (perfluoralkoxy) film (2 mil thick) is immersed in the NaAn solution for about 2 minutes. This treatment results in causing substantial darkening of the PFA surface, indicative of chemical surface modification.

EXAMPLE 15

A NaAn solution is prepared as described in Example 14. A piece of RO2800® (PTFE film with filler) is immersed in the NaAn (radical-anion complex) bath for about 3 minutes, then rinsed with acetonitrile, followed by dipping in a 5 mM PdCl$_2$/ACN solution for 1 minute to give a Pd surface deposit. On placing the Pd seeded sample in a conventional electroless Cu plating bath for about 3 minutes, a continuous Cu deposit is formed on the RO2800 substrate surface.

EXAMPLE 16

A NaAn solution is prepared as described in Example 14. About 20 ml of the NaAn/THF solution is added to about 20 ml of NMP solvent with no visible reaction or color change occurring. The NaAn is stable in this mixture since it is able to instantly darken the surface of PTFE on exposure.

The PTFE sample is immersed in the NaAn solution for about 5 minutes, then subjected to Pd metal seeding and electroless Cu plating as described in Example 15 with similar metallization results.

EXAMPLE 17

A NaAn solution is prepared as follows:

To about 500 ml of anhydrous tetrahydrofuran is added about 4.45 g of anthracene (0.05M) and magnetically stirred for 15 minutes in a nitrogen glove box. About 1.04 g freshly cut sodium metal is thoroughly rinsed with anhydrous THF solvent and then added to the anthracene/THF solution. The characteristic blue color of the anthracene radical-anion streams from the Na particles. This solution is kept stirring for 24 hours before used as a reducing bath. A sample of PTFE measuring 4 cm×4 cm×0.5 cm is immersed in the sodium anthracene (radical-anion complex) solution for 5 minutes, then rinsed with THF and Pd seeded as in Example 8. A highly reflective, electrically continuous electroless Cu film is formed on the PTFE surface by plating as described in Example 1.

EXAMPLE 18

A lithium anthracene anthracene (LiAn) solution is prepared as described in Example 17 using lithium metal shavings instead of Na to generate lithium anthracene complex in THF. The LiAn complex in solution exhibits absorbance peak maxima at 732, 698, 656, 596 and 548 nm. A sample of PTFE is treated in this bath and Pd seeded and electroless Cu subsequently plated as described in Example 17 with similar results. A sample of Teflon PFA is also treated in the LiAn solution and seeded and Cu plated.

EXAMPLE 19

A potassium anthracene (KAn) solution is prepared as described in Example 17 using potassium metal instead of Na to generate potassium anthracene complex reducing bath. A sample of PTFE is treated in this bath and Pd seeded and electroless Cu subsequently plated as described in Example 17 with similar results.

EXAMPLE 20

A potassium anthracene solution is prepared by adding about 17.8 gm of anthracene to about 500 ml of ethylene glycol dimethyl ether (monoglyme) in a flask in a glove box. A total of about 3.8 gm potassium metal is then added to the mixture. This composition gives a 5% by weight KAn solution. The mixture is then stirred overnight to allow the KAn formation to complete. The solution is then brought out of the glove box and placed into a large glass vessel blanketed with Ar gas. The bath effectiveness in modifying the surface of RO2800 samples was periodically tested. The experiment is terminated after 90 hours with the solution still being active.

EXAMPLE 21

A 5% by weight KAn solution is prepared as in Example 20 above and diluted 4:1 with NMP to yield a 1% KAn solution (80% NMP). This mixture is stable and capable of reducing PTFE samples as demonstrated by the surface darkening upon exposure to the solution.

EXAMPLE 22

A KAn solution is prepared as described in Example 20. The monoglyme is allowed to evaporate and the solid potassium anthracide complex collected. The melting point of the potassium anthracide crystals is >300° C. The dark-blue crystals turn white on exposure to air as a result of the radical-anion oxidation. Potassium anthracene salt is added to a solution of anhydrous NMP to give a 0.05M anthracene radical-anion solution resulting in the characteristic deep blue-black coloration of the solution. The KAn is stable in NMP. A sample of PTFE is treated in this bath and Pd seeded and electroless Cu subsequently plated as described in Example 17 with similar results.

EXAMPLE 23

A 25% by weight KAn (1.02 Molar) THF solution is prepared by adding about 290.4 gm anthracene and about 63.5 gm K metal to about 1600 ml of THF. About 500 to 600 ml portions of the dissolved KAn/THF solution are removed from the glove box and rotory evaporated under reduced pressure in a chemical hood. A blue colored crystalline solid remains after the solvent is removed. About 270 gm of the KAn solid is then added to a glass tank containing about 2300 ml of NMP solvent under ambient conditions. After the addition, the solution is blanketed with a N$_2$ gas and a non hermetic aluminum foil cover. The activity of the bath is checked periodically by immersing PTFE and RO2800 samples for about 15 seconds and noting whether any surface modification (darkening) occurs. The bath is effective after 1000 hours, with no evidence of any loss in reducing power.

EXAMPLE 24

A NaAn/NMP solution is prepared using the procedure of Example 22. A sample of PTFE is treated in this bath and Pd seeded and electroless Cu plated with similar results as for Example 17.

EXAMPLE 25

A benzophenone radical-anion solution is prepared as in Example 15 using about 4.55 g benzophenone instead of anthracene to generate a sodium benzophenone radical-anion complex/THF solution. A sample of PTFE is treated in this bath and Pd seeded and electroless Cu subsequently plated as described in Example 17 with similar results.

EXAMPLE 26

A potassium benzophenone complex and NMP solution is prepared as described in Example 20 for KAn synthesis. This mixture is stable and capable of reducing PTFE samples. PTFE, PFE and RO2800 samples treated in this bath and Pd seeded followed by electroless Cu plating as described in Example 17 yielded similar results.

EXAMPLE 27

A piece of Teflon PTFE is immersed in Tetra-Etch® (W. L. Gore, Inc.) solution (sodium naphthalide) for 1 minute, then rinsed with monoglyme, followed by immersing into 5 mM PdCl$_2$/ACN solution. The sample when exposed to an electroless Cu plating solution deposited a bright, uniform Cu layer onto the surface, indicating Pd seeding in prior steps.

EXAMPLE 28

A potassium phenanthridine (radical-anion complex) solution is prepared by adding about 3.5 g phenanthridine and about 0.75 g potassium metal to about 20 ml of monoglyme yielding a red-colored product. A sample of PTFE, PFA and RO2800 each immersed for 3 minutes in this bath show surface discoloration indicative of chemical modification as discussed hereinabove.

EXAMPLE 29

An anthracene/DMF reducing solution is prepared as detailed in Example 1. A PTFE substrate measuring 5 cm×5 cm×165 mils thick and containing drilled through holes having 18 mils diameter or an aspect ratio of 9.16-to-1 is exposed to the reducing bath for 10 minutes with constant agitation of the substrate to promote solution flow through the vias. After reduction, the substrate is Pd seeded as described in Example 8 and electrolytically plated using acid Cu sulfate bath as described in Example 1. Photomicrographic analysis of through hole cross sections shows uniform and complete Cu coverage of the plated through holes.

EXAMPLE 30

A electrolyte solution consisting of 0.1M tetrabutyl-ammonium fluoroborate in N,N'-dimethylformamide is placed in a flat dish under ambient conditions and allowed to saturate with oxygen. The cathode (working) electrode consists of a stainless steel rod (2 mm dia) that is insulated except for the flat end. A Pt wire is used as the counter (anode) electrode and both electrodes are maintained in the electrolyte solution without use of separate compartments. A constant current of 10 mA is applied to the electrodes. A piece of pure polytetrafluoroethylene is placed at the bottom of the cell and is then contacted with the cathode electrode. The polytetrafluoroethylene surface at the point electrode contact instantly is discolored resulting in a black appearance. The region which became black (modified) is confined to the electrode contact area. However, extended contact causes "spreading" of the black area, i.e., further surface modification extending from the contact point. Moving the electrode along the polymeric surface causes surface modification along all contact points and a black image is generated across the surface using a "writing" motion. Those regions which has been modified show excellent wettability on exposure to distilled water.

EXAMPLE 31

An electrolyte solution and electrochemical arrangement as described above in example 1 is assembled in a nitrogen glove box. Polytetrafluoroethylene and RO2800 (glass/ceramic filled polytetrafluoroethylene) samples are selectively reduced as defined in Example 21.

After the patterned surface modifications are made, the samples are immersed in an N-methyl-2-pyrrolidone solution containing about 5 mM PdCl$_2$ for about 30 seconds to deposit palladium metal.

The samples are then exposed to an electroless copper plating bath as described in Example 1 resulting in copper deposition only on those regions that are selectively reduced. The Cu deposits adhere quite well and are electrically continuous across the modified surface regions. Isolated metal patterns are not shorted.

EXAMPLE 32

A electrolyte solution consisting of 0.1M TBAFB in DMF is placed in a flat dish inside of a nitrogen filled glove box. A piece of PTFE measuring 4 cm×4 cm×0.7 cm is immersed into the electrolyte bath and held in place by a supporting fixture. The electrochemical circuit is comprised of a Pt mesh anode and a hand-held drill with 1.5 mm dia. bit is connected to the power supply to function as the cathode. A constant current of 10 mA is applied to the drill bit while several through holes are formed in the PTFE substrate. The substrate is then removed and Pd seeded as described in Example 8 which results in a uniform Cu deposit on the walls of the drilled holes.

What is claimed is:

1. A method of treating a halogenated polymeric-containing substrate, comprising the steps of:

exposing at least portions of said halogenated polymeric-containing substrate to a composition containing a reducing agent and an aprotic solvent selected from the group consisting of nitriles, nitro compounds, amides, esters, carbonates, oxides, sulfo compounds and mixtures thereof, wherein said solvent is free of ethers, amines, ammonia, and wherein said composition is prepared by reacting a metal with an organic compound selected from the group consisting of polyaryl compounds, aromatic carbonyl containing compounds, aromatic nitriles, and aromatic heterocyclic nitrogen containing compounds in a reaction solvent which does not react with said metal but permits reaction between said metal and said organic compound to thereby provide said reducing agent, isolating said reducing agent from said reaction solvent to obtain a reaction product as a solid, adding said reaction product to said aprotic solvent; and contacting said treated substrate with a material to promote adhesion of said material to said treated surface.

2. A method according to claim 1, wherein said aprotic solvent is selected from the group consisting of cyclic amides and cyclic esters.

3. The method of claim 1 wherein, said reducing agent is formed form a neutral organic compound that is at least one specie selected from the group consisting of carbodiimides and quaternary aromatic nitrogen compounds.

4. The method of claim 1 wherein said chemical reducing agent is a neutral organic or organometallic compound whereby all or a portion of the said neutral organic compound has been electrochemically reduced in an aprotic solvent containing a supporting electrolyte salt.

5. The method of claim 1 wherein said halogenated polymeric material containing substrate is a free-standing or supported film of a polymer selected from the group consisting of poly(tetrafluoroethylene), copolymers of tetrafluoroethylene and hexafluoropropylene, polytrifluorochloroethylene, copolymers of tetrafluoroethylene and an olefin, copolymers of trifluorochloroethylene and an olefin, copolymer of tetrafluoroethylene and polyperfluoroalkoxy resin, polyvinyl fluoride, polyvinylidene fluoride, polyvinyl chloride, polyvinylidene chloride, copolymer of poly(tetrafluoro)ethylene and poly(di-trifluoromethyl (dioxole difluoro)ethylene, and mixtures thereof.

6. The method of claim 1 wherein said halogenated polymeric material-containing substrate has a thickness of about 100 angstroms to 5 mils.

7. The method of claim 4 wherein, said aprotic solvent is at least one member selected from the group consisting of cyclic amides and cyclic esters.

8. The method of claim 1 wherein the said chemical reducing agent is an organic or organometallic compound whereby all or a portion of the said organic or organometallic compound has been chemically reduced by an alkali or alkaline earth metal.

9. The method of claim 1 wherein said reducing agent is formed form a neutral organic compound that is at least one specie selected from the group consisting of unsaturated aromatic hydrocarbons, aromatic carbonyl compounds, imides, diimides, nitriles, anhydrides, quitones, aromatic heterocyclic nitrogen compounds, azomethines, immonium salts, azo compounds, amine oxides, nitro and nitroso compounds and organometallic compounds.

10. The method of claim 1 wherein said reducing agent is selected from the group consisting of anthracene radical-anion, 9,10-diphenylanthracene radical anion, benzophenone anign, anthraquinone anion, N-N-butylphthalimide anion, phthalonitrile anion, acridine anion, trans-stilbene anion, naphthalene radical-anion, phenanthridine radical-anion, perylene radical anion and ruthenium (tribipyridyl) diperchlorate.

11. The method of claim 10 wherein a cation of said reducing agent is at least one member selected from the group consisting of tetraalkylammonium, tetraalkylphosphonium, alkali metal, mixed alkyl-aryl ammonium, mixed alkyl-aryl phosphonium, or chelated metal.

12. The method of claim 4 wherein said supporting electrolyte salt contains a cation which is at least one member of the group consisting of tetraalkylammonium, tetraalkylphosphonium, alkali metal, mixed alkyl-aryl ammonium, mixed alkyl-aryl phosphonium, or chelated metal and said supporting electrolyte salt contains an anion that is at least one member selected from the group consisting of tetrafluoroborate, hexafluorophosphate, perchlorate, halide, aryl sulfonate, and aromatic organic compounds.

13. The method of claim 4 wherein said supporting electrolyte salt contains at least one member selected from the group consisting of tetrabutylammonium tetrafluoroborate, tetraethylammonium tetrafluoroborate, tetrabutylammonium hexafluorophosphate, tetraethylammonium bromide, lithium tetrafluoroborate, lithium perchlorate, benzyltributylammonium tetrafluoroborate, potassium anthracene, and sodium naphthalenene.

14. The method of claim 4 wherein said aprotic solvent is at least one member selected from the group consisting of nitriles, nitro compounds, amides, amines, esters, ethers, carbonates, oxides, and sulfo compounds.

15. The method of claim 1 wherein said metal is a metal cation metal or metal complex wherein said metal is selected from the group consisting of palladium, platinum, ruthenium, silver, gold, copper, nickel, cobalt, and tin.

16. The method of claim 15 wherein said metal complex is selected from the group consisting of $PdCl_2$, $PdBr_2$, $Pd(ACN)_2Cl_2$ $CuBF_4$, $CuIP(OCH_3)_3$, $AgBF_4$, $NiBr_2$, $CoCl_2$.

17. The method of claim 14 wherein said metal is at a depth no greater than 2000 angstroms below the surface of said halogenated polymeric material containing substrate.

18. The method of claim 2 wherein said metals are at a depth no greater than 800 angstroms below the surface of said polymeric material.

19. The method of claim 1 wherein said metal is at a depth no greater than 200 angstroms below the surface of said halogenated polymeric material containing substrate.

20. The method of claim 1 wherein said reducing agent is prepared by reacting a metal with an organic compound to form a reaction product, said organic compound is selected from the group consisting of polyaryl compounds, aromatic carbonyl containing compounds, aromatic nitriles an aromatic heterocyclic nitrogen containing compounds in a solvent which does not react with said metal but permits reaction between said metal and said organic compound.

21. The method of claim 20 wherein said metal is an alkali metal.

22. The method of claim 21 wherein said organic compound is selected from the group consisting of anthracene, 9,10-diphenylanthracene, benzophenone, phenanthridine, phthalonitrile, perylene and fluorene.

23. The method of claim 20 wherein the reducing agent is isolated from said solvent to obtain the reaction product in crystalline form.

24. The method of claim 23 wherein said reaction product is added to a solvent for contacting with said substrate.

25. The method of claim 24 wherein said solvent is selected from the group of N-methyl-2-pyrrolidone, N,N-dimethylformamide, acetonitrile and propylene carbonate.

26. The method of claim 24 wherein said solvent is free of ether and amine.

27. The method of claim 1 wherein said metal is an alkali metal.

28. The method of claim 27 wherein said organic compound is the group consisting of anthracene, 9,10-diphenylanthracene, selected from benzophenone, phenanthridine, phthalonitrile, perylene and fluorene.

29. The method of claim 1 wherein said aprotic solvent is selected from the group consisting of N-methyl-2-pyrrolidone, N,N-dimethylformamide, dimethyl sulfoxide, acetonitrile and propylene carbonate.

30. The method of claim 1 wherein said reaction solvent is selected from the group consisting of ammonia, ethers and amines.

31. A method according to claim 1 wherein said material is selected from the group consisting of a metal, a polymer, a glass, wood, a ceramic and a glass ceramic.

32. A method according to claim 27 further including contacting said halogenated polymeric surface with another material to promote adhesion of said other material to said treated surface.

33. A method according to claim 32 wherein said material is selected from the group consisting of a metal, a polymer, a glass, wood, a ceramic and a glass ceramic.

* * * * *